US006972640B2

(12) United States Patent
Nagamori et al.

(10) Patent No.: US 6,972,640 B2
(45) Date of Patent: Dec. 6, 2005

(54) DIRECTIONAL COUPLER, HIGH FREQUENCY CIRCUIT MODULE AND WIRELESS COMMUNICATION SYSTEM

(75) Inventors: Hiroyuki Nagamori, Komoro (JP); Hitoshi Akamine, Maebashi (JP); Shun Imai, Komoro (JP); Satoshi Arai, Gunma (JP); Yasuhiro Nunogawa, Takasaki (JP)

(73) Assignees: Renesas Technology Corporation, Tokyo (JP); Hitachi ULSI Systems Co., Ltd., Tokyo (JP)

( * ) Notice: Subject to any disclaimer, the term of this patent is extended or adjusted under 35 U.S.C. 154(b) by 364 days.

(21) Appl. No.: 10/260,310

(22) Filed: Oct. 1, 2002

(65) Prior Publication Data

US 2003/0027539 A1 Feb. 6, 2003

Related U.S. Application Data

(63) Continuation of application No. 09/848,368, filed on May 4, 2001, now Pat. No. 6,483,398.

(30) Foreign Application Priority Data

May 19, 2000 (JP) .............................. 2000-148290
Oct. 25, 2000 (JP) .............................. 2000-325767

(51) Int. Cl.[7] .............................................. H01P 5/18
(52) U.S. Cl. ...................................... 333/116; 333/109
(58) Field of Search ........................ 333/109, 110, 112, 333/115, 116, 117, 172

(56) References Cited

U.S. PATENT DOCUMENTS

| 4,809,356 | A |   | 2/1989  | Peckham et al. ............. 455/86  |
|-----------|---|---|---------|-------------------------------------|
| 5,212,815 | A |   | 5/1993  | Schumacher ................ 455/126  |
| 5,634,208 | A |   | 5/1997  | Nishikawa et al. ......... 455/327   |
| 5,903,820 | A |   | 5/1999  | Hagstrom .................... 455/82  |
| 5,907,266 | A |   | 5/1999  | Budka et al. ................ 333/116 |
| 5,973,568 | A |   | 10/1999 | Shapiro et al. ............. 330/295  |
| 5,974,305 | A |   | 10/1999 | Matero .................... 455/188.1  |
| 6,005,442 | A | * | 12/1999 | Maeda et al. ............... 330/295  |
| 6,069,581 | A | * | 5/2000  | Bell et al. ..................... 342/70 |
| 6,151,509 | A |   | 11/2000 | Chorey ....................... 455/550  |

* cited by examiner

*Primary Examiner*—Dean Takaoka
(74) *Attorney, Agent, or Firm*—Reed Smith LLP; Stanley P. Fisher, Esq.; Juan Carlos A. Marquez, Esq.

(57) ABSTRACT

A directional coupler for detecting an output of a high frequency circuit module includes a main line and a sub-line overlapped with the main line with a dielectric material. The sub-line is set, in width, narrower than the main line and both side edges of the sub-line are allocated at the internal side of both side edges of the main line. Accordingly, the sub-line is surely provided opposed to the main line in the total width area and a signal current flowing into the main line can be detected in higher accuracy. Therefore, a wireless communication system for controlling an output of the high frequency circuit module by including such directional coupler assures stable communication.

21 Claims, 18 Drawing Sheets

PATTERN A

PATTERN B

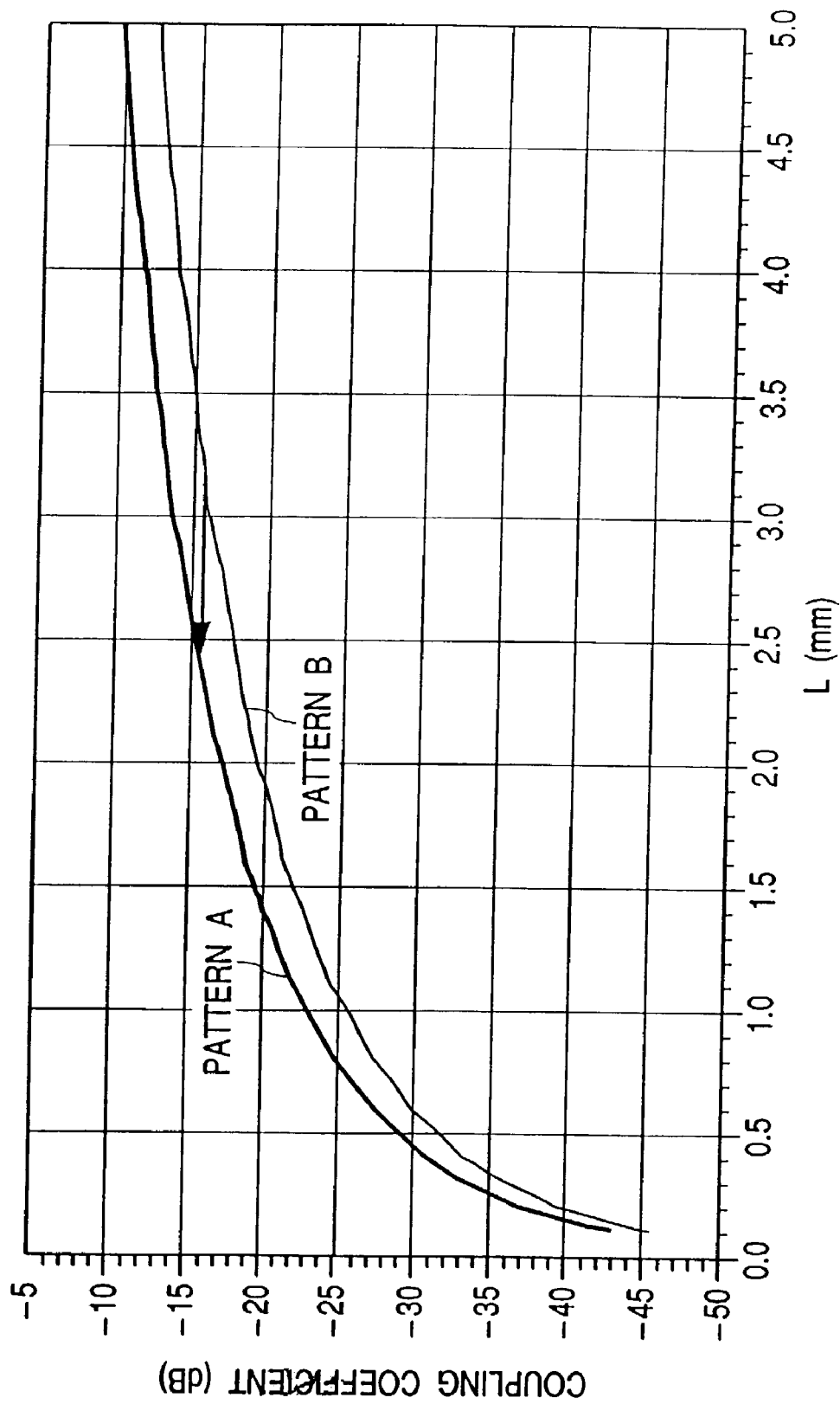

PATTERN A

PATTERN B

DIRECTIONAL COUPLER, HIGH FREQUENCY CIRCUIT MODULE AND WIRELESS COMMUNICATION SYSTEM

This application is a continuation application of U.S. application Ser. No. 09/848,368 filed on May 4, 2001 now U.S. Pat. No. 6,483,398.

BACKGROUND OF THE INVENTION

The present invention relates to a directional coupler, a high frequency circuit module comprising the same directional coupler and a wireless communication system comprising the same high frequency circuit module, and particularly to the technique that can effectively be adapted to the wireless communication technology to realize the communication under the stable output of a high frequency power amplifier controlled with high accuracy.

In a transmitting side output stage of a transmitter of wireless communication equipment (mobile communication equipment) such as a mobile telephone set and a hand-held telephone set or the like, an amplifier comprising in the multiple stages a MOSFET (Metal Oxide Semiconductor Field Effect Transistor) and a GaAs-MES (Metal Semiconductor) FET or the like is used.

For the hand-held telephone set, a system is already established so that the communication is performed by varying an output depending on the ambient environment with a power control signal transmitted from a base station considering the operational environment and thereby any interference is never generated against the other hand-held telephone sets.

For example, in view of avoiding the interference against the other systems, the power control signal is transmitted from the base station of a digital hand-held telephone system to the hand-held terminals (hand-held telephone sets) in order to provide the minimum output required for the communication. At the inside of a terminal utilizing a higher frequency power amplifier comprising FET such as MOS-FET or the like, a microcomputer of the baseband unit monitors the power control signal transmitted from the base station and an output of the high frequency power amplifier to adjust the output power by changing a power control signal (Vapc) to be applied to the control terminal of the high frequency power amplifier.

This high frequency power amplifier is described in "The Nikkei Electronics", Jan. 27, 1997, p115 to p126, published by the Nikkei BP Co., Ltd. This reference reports the standard system of the 900 MHz Band Cellular System Hand-Helt Telephone System in the North America and the GSM (Global System for Mobile Communications) system in Europe.

Moreover, "The Hitachi Review", Vol. 79, No. 11 (1997), P63 to P38, published by the Hitachi Review Co., Ltd. reports an analog signal processing IC of high frequency unit for digital cellular standards "GSM/EGSM". This reference discloses a block diagram for detecting an output of the high frequency power amplifier with a directional coupler and for controlling a power amplifier module with a power detection signal.

A directional coupler is described, for example, in the "Basic Items and Applications of a Microwave Circuit", Jul. 10, 1997; P191 to P193, published by the General Electronics Publication Co., Ltd. This reference reports a distributed coupling type directional coupler.

On the other hand, "The Electronic Materials", April, 1999, P91 to P95, published by the Industrial Investigation Society reports a ceramics-laminated low-pass filter and a directional coupler for 1608 type mobile communication. These low-pass filter and directional coupler are formed as the discrete parts.

SUMMARY OF THE INVENTION

In the hand-held telephone system, base stations transmit, to the hand-held terminals (hand-held telephone sets) the signal (power control signal) to control the transmission power to provide the minimum output required for communication. In the hand-held terminals, a high frequency power amplifier of the output stage in the transmitting side is controlled with an APC (Automatic Power Control) circuit operating based on such control signal. Namely, the high frequency amplifier is controlled to provide the output required for communication. To realize such control operation, a circuit for detecting the power of the power amplifier is required.

A directional coupler is used for detecting an output of the high frequency power amplifier and in addition employs a method of comprising a discrete directional coupler as an external part and a structure to form, through direct depiction, a part corresponding to a coupler on a dielectric material substrate based on the concept of $\lambda/4$ line.

That is, the aforementioned reference (Basic Items and Applications of the Microwave Circuit) discloses a structure where a conductor pattern is provided at one surface of the dielectric material substrate as one of the directional couplers and a ground conductor is also provided at the rear surface. In this specification of the present invention, this structure is called a parallel type directional coupler. In this parallel type directional coupler, the conductor pattern is formed as the distributed coupling type parallel two lines. Namely, the main line as the transmission path and the sub-line as the line for detection are extended in the width of the same size for the predetermined distance in the constant interval.

Moreover, one of the other directional couplers disclosed has a structure that two strips are formed by overlapping the main line and sub-line within the dielectric material via the dielectric material layer. In this specification, this structure is called an overlapping type directional coupler. This overlapping type directional coupler also has the structure that the main line and sub-line of the width in the same size are also extended for the predetermined distance with a constant interval therebetween.

However, in these directional couplers, the line width is equal in the main line (transmission line) and sub-line (detection line). Therefore, particularly in the case of the overlapping type directional coupler, if the sub-line is deviated for the main line, an output value of the directional coupler will be changed easily. As a result, when the high frequency circuit module such as a high frequency power amplifier (high frequency power amplifier module) is controlled with this detection signal, it becomes difficult that an output of the high frequency circuit module is controlled with higher accuracy. Therefore, a wireless communication system comprising such high frequency circuit module has come to have a fear for disabling stable communication.

An object of the present invention is to provide a directional coupler that can detect a transmission output of a main line with higher accuracy.

Another object of the present invention is to provide a high frequency circuit module comprising a directional coupler that can detect an output with higher accuracy.

The other object of the present invention is to provide a wireless communication system assuring stable communication by monitoring an output with higher accuracy.

The aforementioned and the other objects and novel characteristics of the present invention will become more apparent from the description of this specifications and the accompanying drawings thereof.

The summary of the typical inventions of those disclosed in the present application will be briefly explained as follows.

(1) A directional coupler includes a main line forming the transmission line and a sub-line forming the detection line which are different respectively in the line width. For example, the width of the main line is wider than the sub-line. In the overlapping type directional coupler, both side edges of the sub-line are located, in the main line and sub-line that are overlapped with each other, at the inside of both side edges of the main line.

(2) In the high frequency circuit module comprising an amplifying system comprising a plurality of stages of the amplifying stage including at least the initial stage and the final stage and a directional coupler for detecting an output of the final stage of the amplifying system, the line width of the main line forming the transmission line of the directional coupler is wider than the sub-line forming the detection line. The directional coupler is of the overlapping type and both side edges of the sub-line, in the main line and sub-line that are mutually overlapped with each other, are never extruded to the outside from both side edges of the main line and are located within the internal side of the main line. An impedance of the main line is smaller than that of the sub-line.

(3) A high frequency circuit module comprises a amplifying system comprising a plurality of stages of amplifying stages including at least the initial stage and final stage, a directional coupler for detecting an output of the final stage of the amplifying system and an output control circuit for receiving a power detection signal and a power control signal detected with the directional coupler and supplying the power control signal to each amplifying stage. The width of the main line forming the transmission line of the directional coupler is wider than that of the sub-line forming the detection line. The directional coupler is of the overlapping type and both side edges of the sub-line, in both main line and sub-line that are overlapped with each other, are never extruded to the outside of both side edges of the main line and are located within the inside thereof. An impedance value of the main line is smaller than that of the sub-line.

(4) A high frequency circuit module comprises an amplifying system comprising a plurality of stages of the amplifying stage including at least the initial stage and final stage, a directional coupler for detecting an output of the final stage of the amplifying stage, an output control circuit for receiving a power detection signal and power control signal detected with the directional coupler and supplying the power control signal to each amplifying stage, a filter connected to the final stage of the amplifying system and an antenna switch circuit connected to the filter. Line width of the main line forming the transmission line of the directional coupler is wider than that of the sub-line forming the detection line. The directional coupler is of the overlapping type and both side edges of the sub-line is never extruded, in the main line and sub-line that are overlapped with each other, to the outside from both edges of the main line and are located within the inside thereof. An impedance value of the main line is smaller than that of the sub-line.

(5) In the high frequency circuit module in any one of the structures of items (1) to (4), a plurality of stages of the amplifying systems are provided.

(6) In the structures of items (1) to (5), the main line is narrower than the sub-line. Namely, the high frequency circuit module comprising an amplifying system comprising a plurality of amplifying stages including at least the initial stage and final stage and a directional coupler for detecting an output of the final stage of the amplifying system and the width of the main line forming the transmission line of the directional coupler is smaller than that of the sub-line forming the detection line. The directional coupler is of the overlapping type and both side edges of the main line, in the main line and sub-line that are overlapped with each other, are located in the internal side of both side edges of the sub-line. Impedance of the main line is larger than that of the sub-line. Moreover, a matching circuit for impedance matching is provided between the main line and the final amplifying stage, while a matching circuit for impedance matching against a device for detecting a current of the sub-line is provided between the sub-line and an output terminal of the sub-line.

(7) A wireless communication system comprises a high frequency circuit module of any structure of items (1) to (6).

According to the means of item (1), (a) the main line becomes wider than the sub-line and thereby loss of the main line can be reduced, and (b) in the case of the overlapping type directional coupler, since both side edges of the sub-line are never extruded to the outside of both side edges of the main line and located in the internal side thereof, the total area of the line width of the sub-line can surely be provided are opposed to the main line and thereby highly accurate power detection can be performed.

According to the means of item (2), (a) since both side edges of the sub-line are never extruded to the outside from both side edges of the main line and are located within the internal side thereof in the overlapping type directional coupler in the high frequency circuit module and the main line width is wider than the sub-line width, the sub-line is surely placed opposed to the main line in the total line area and thereby the power can be detected with higher accuracy, and (b) since the line width of the main line can be set larger than that of the sub-line, the line width of the main line can be selected freely. Accordingly, from the point of view of the high frequency circuit module to be built into a wireless communication system, the main line can be comprised as a part of the matching element of module, resulting in the parts saving effect and loss reducing effect.

Even in any high frequency circuit module of those in the items (3) to (5) the effect similar to that of the module having the means of item (2) can also be attained.

According to the means of item (6), in the directional coupler, (a) since the width of the main line is set narrower (shorter) than that of the sub-line, the coupling coefficient increases, whereby the overlapping length (coupling length) between the main line and sub-line can be set short and reduction in size of the high frequency circuit module can be attained and moreover since the coupling length can be shortened, the loss of signal passing the main line can also be reduced, and (b) since both side edges of the main line is never extruded to the outside from both side edges of sub-line and are located in the inside thereof, the total line width can surely be provided opposed to the main line and thereby highly accurate power detection can be performed.

According to the means of item (7), since the power detection of the high frequency circuit module can be performed in higher accuracy, high precision output control is possible for the high frequency circuit module and thereby stable communication can be realized.

BRIEF DESCRTPTION OF THE DRAWINGS

FIG. 22 is a characteristic diagram illustrating the coupling efficiency of the overlapping type coupler (pattern A) and the other overlapping type coupler (pattern B) of the embodiment 7.

Figure 27A:
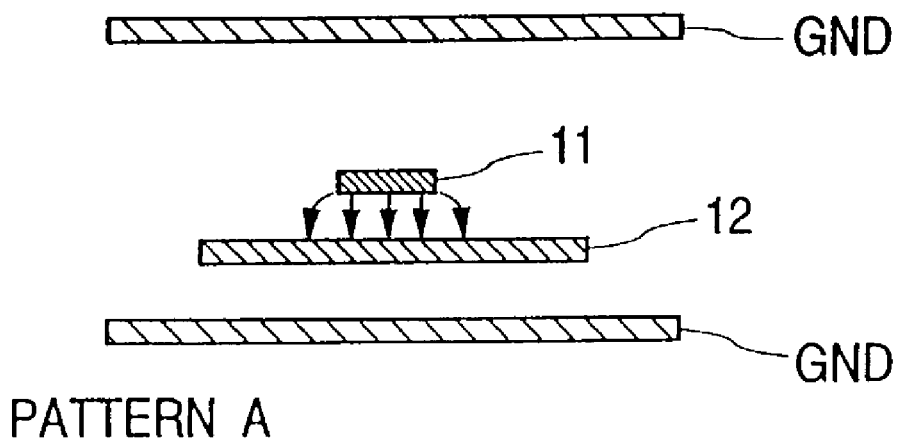
Figure 27B:
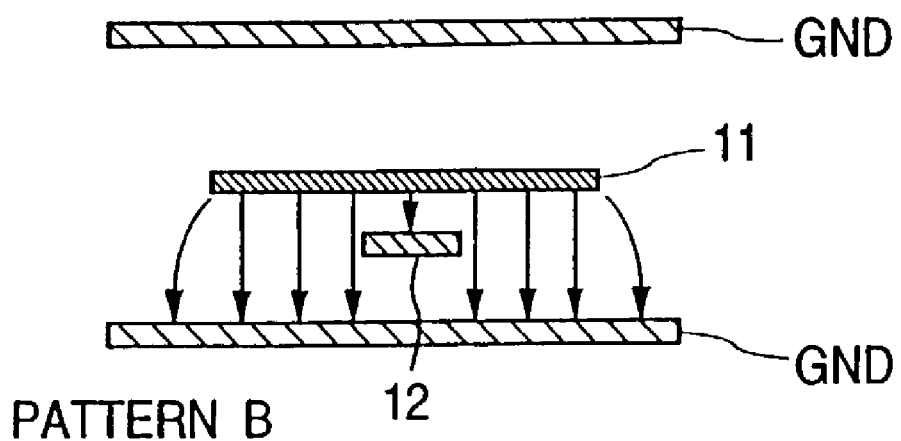

FIGS. 27(A) and 27(B) are schematic diagrams illustrating the electric field distribution in the overlapping type coupler (pattern A) and the other overlapping type coupler (pattern B).

DESCRIPTION OF THE PREFERRED EMBODIMENTS

The preferred embodiments of the present invention will be explained in detail with reference to the accompanying drawings. The like functional elements will be designated with the like reference numerals throughout the drawings in view of explaining the embodiments and the same explanation will be omitted.

(Embodiment 1)

FIG. 1 to FIG. 10 are diagrams in relation to the high frequency circuit module comprising a directional coupler as one embodiment (embodiment 1) of the present invention.

Figure 1:
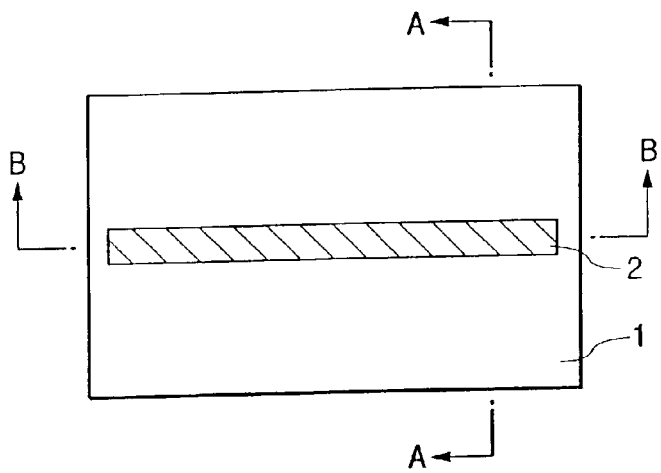
FIG. 1 is a plan view of a directional coupler in a high frequency circuit module as the first embodiment of the present invention.
Figure 2:
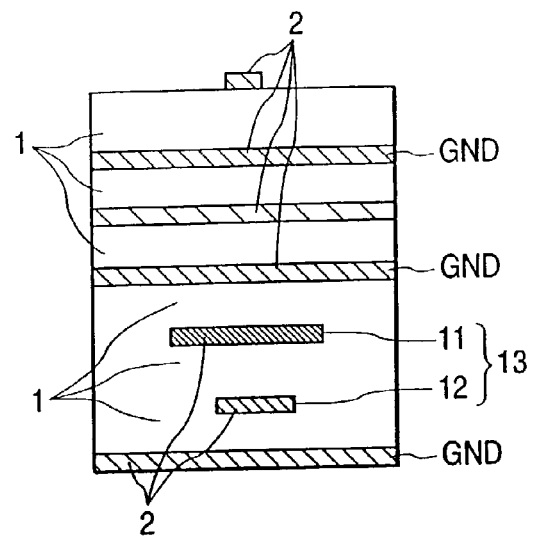
FIG. 2 is a cross-sectional view along the line A—A of FIG. 1.
Figure 3:
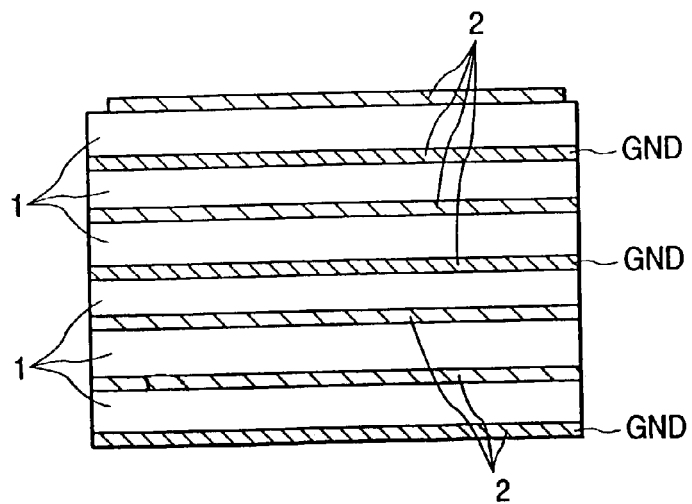
FIG. 3 is a cross-sectional view along the line B—B of FIG. 1.
Figure 4:
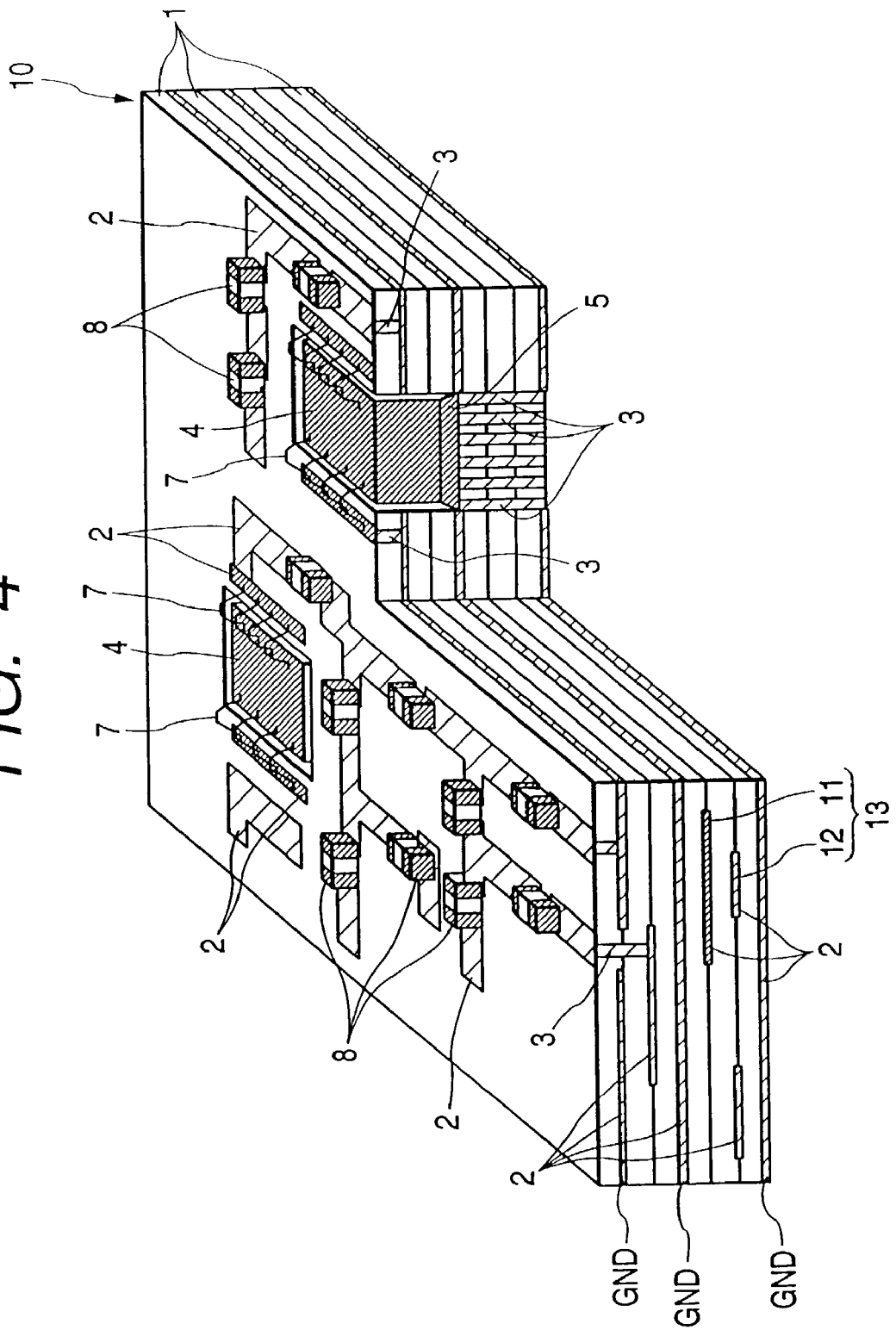
FIG. 4 is a conceptual perspective view illustrating a part of the high frequency circuit module of the embodiment 1.
Figure 5:
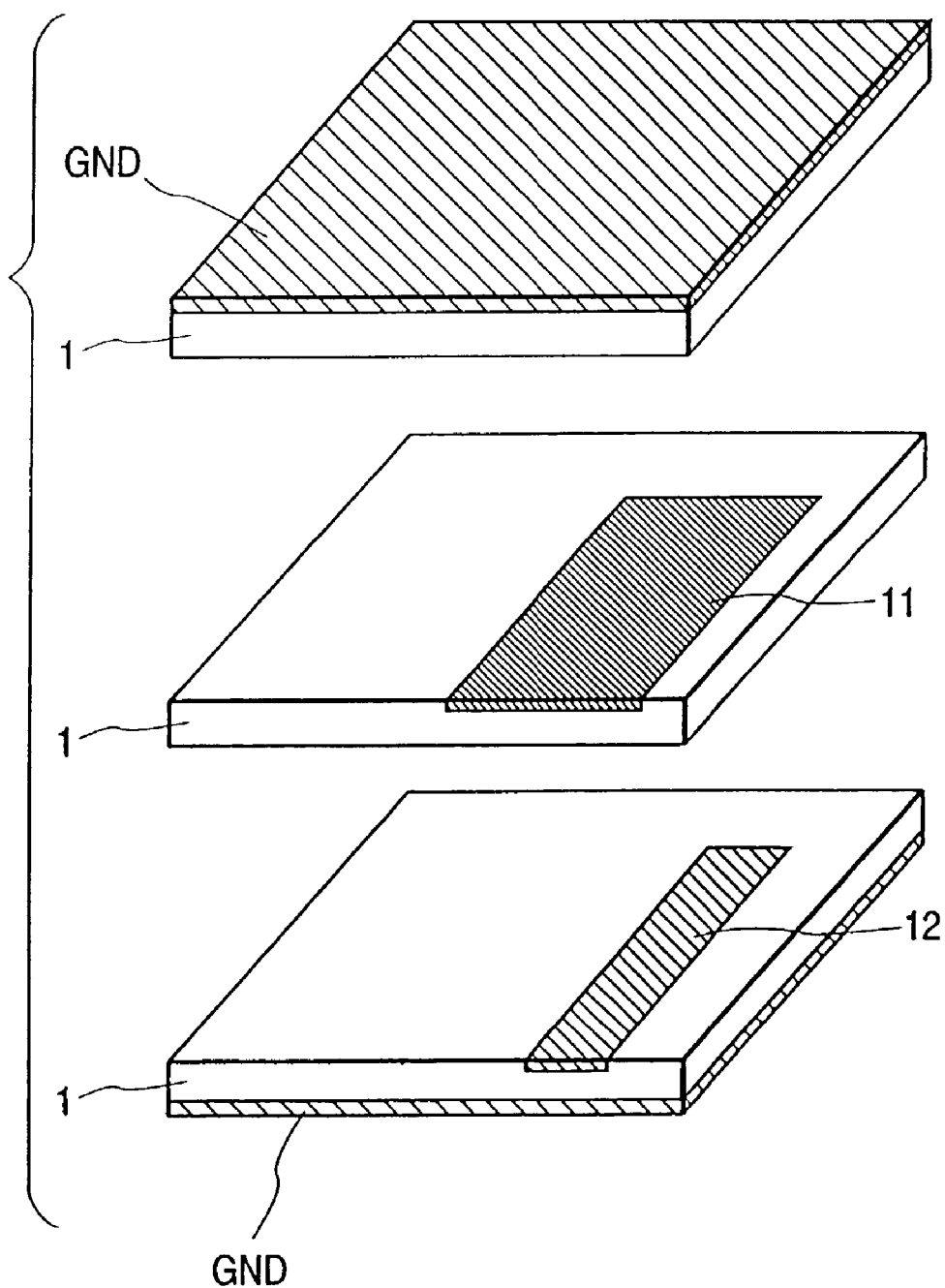
FIG. 5 is a conceptual disassembled perspective view of a directional coupler in the high frequency circuit module.

FIG. 1 to FIG. 3 are diagrams illustrating a part of the directional coupler comprised in the high frequency circuit module. FIG. 4 and FIG. 5 are perspective view illustrating a part of the high frequency circuit module and a disassembled perspective view of the directional coupler.

Here, the high frequency circuit module includes at least a high frequency power amplifier (high frequency power amplifier: PA) in this specification. In this embodiment 1, a high frequency circuit module comprises a directional coupler.

A wiring substrate 10 forming the body part of the high frequency circuit module has a structure, as illustrated in FIG. 4, that a plurality of dielectric material plates 1 are laminated and integrated through the sintering process. Each dielectric material plate 1 is provided at the front and rear surfaces with a patterned conductor layers 2. Moreover, in order to electrically connect the conductive layers 2 at the front and rear surfaces, the holes called the through-holes are provided at the dielectric material plate 1 and these through-holes are filled with a conductor 3.

In this embodiment 1, although not particularly limited, a dielectric material plate 1 is comprised of six plates as illustrated in the figure and the lower surfaces (rear surfaces) of the first, third and sixth layers counted from the upper layer are respectively defined as the ground layer (GND). The conductive layer 2 of each remaining surface forms the transmission line or the like.

The upper three layers including the highest layer are provided with rectangular mounting holes 5 in order to allocate transistors 4 to form an amplifying system. The dielectric material plates 1 of the lower three layers in the region corresponding to this mounting holes 5 are provided with holes called the via-holes. These via-holes are filled with conductor 3. The conductor 3 in the via-holes plays a role of transmitting the heat generated in the transistor 4 to the conductor layer 2 of the lowest layer (GND). Therefore, many via-holes are provided to quickly transfer the generated heat.

The transistor 4 is fixed at the bottom of the mounting hole 5 via a junction material. Moreover, each electrode on the upper surface of the transistor 4 and the predetermined conductive layer 2 are electrically connected with a conductive wire 7. As the transistor, although not particularly limited, for example, MOSFET is used. The amplifying system is formed of a plurality of amplifying stages including at least an initial stage and a final stage. In view of forming each amplifying stage, a plurality of transistors are used.

Moreover, at the surface of the dielectric material plate 1 of the first layer of the highest layer, namely at the main surface (front surface) of the wiring substrate 10, a plurality of chip-type electronic parts 8 forming capacitors and resistors are mounted to form a matching circuit.

As a characteristic of the present invention, a directional coupler 13 is formed as illustrated in the former left of FIG. 4 by providing a main line 11 forming the transmission line on the front surface (upper surface) of the fifth layer and also providing a sub-line forming the detection line at the rear surface (lower surface) of the fifth layer.

FIG. 5 is a disassembled perspective view for schematically explaining a part of the directional coupler 13. Namely, each dielectric material plate 1 of the fourth, fifth and sixth layers counted from the upper side is illustrated. In view of forming the directional coupler 13, the ground layer (GND) is provided on the upper surface of the dielectric material plate 1 of the fifth layer 5. The main line 11 is provided on the upper surface of the dielectric material plate 1 of the fifth layer. A sub-line 12 that is narrower than the main line 11 in the width is provided on the upper surface of the sixth layer. Both side edges of this sub-line 12 are never extruded to the external side from both side edges of the main line 11 and are located within the internal side thereof.

The sub-line 12 is restricted to be located within the line width of the main line 11 but since the line width of the main line 11 is not restricted, the line width of the main line 11 can be selected freely. The loss reducing effect can be attained by widening the width of the main line and utilizing the main line as a matching element.

FIG. 1 to FIG. 3 are diagrams for schematically explaining a part of the directional coupler 13. FIG. 2 is a cross-sectional view along the line A—A of FIG. 1 and FIG. 3 is a cross-sectional view along the line B—B of FIG. 1.

As illustrated in FIG. 2, the sub-line 12 is overlapped on the main line 11 via the dielectric material plate 1 (dielectric material layer). Width of the main line 11 is wider than that of the sub-line 12. Both side edges of the sub-line 12 provided opposed to the main line 11 are allocated within the line of the main line 11. Therefore, if manufacturing error is generated, it is possible to prevent that the sub-line 12 is extruded to the external side from the edge of line of the main line 11.

Figure 6:
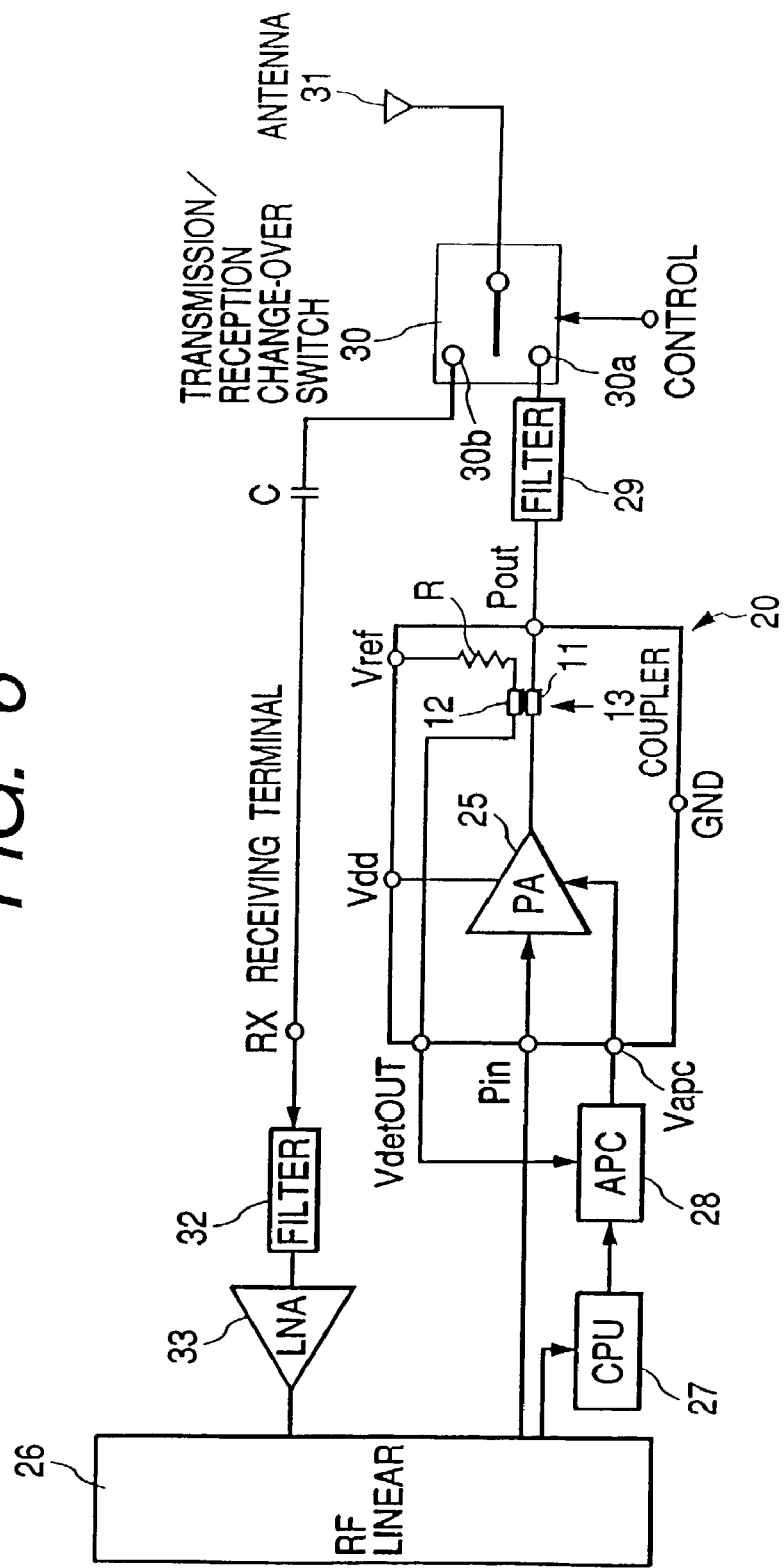
FIG. 6 is a block diagram illustrating a part of the wireless communication system comprising the high frequency circuit module of the embodiment 1.

Next, referring to FIG. 6 to FIG. 10, a more practical example will be explained. In this example, as a high frequency circuit module 20, a high frequency power amplifier (PA) and a directional coupler 13 are integrated as illustrated FIG. 6. FIG. 6 is a block diagram illustrating a part of the wireless communication system including the elements covering from a high frequency signal processing IC (RF linear) to an antenna 31.

The antenna 31 is connected to a transmission/ reception change-over switch 30 and the transmitting system circuit and receiving system circuit are provided between this transmission/reception change-over switch 30 and the high frequency signal processing IC 26.

The transmitting system circuit comprises a high frequency circuit module 20 connected to the high frequency signal processing IC 26, a filter 29 connected to the terminal a 30a of the transmission/reception change-over switch 30, a CPU 27 connected to the high frequency signal processing IC 26 and an APC circuit 28 connected to the high frequency circuit module 20.

The receiving system circuit comprises a capacitor C connected to the terminal b 30b of the transmission/reception change-over switch 30, a receiving terminal connected to this capacitor, a filter 32 connected to this receiving terminal and a low noise amplifier (LNA) 33 connected to this filter 32 and high frequency signal processing IC 26.

The transmission/reception change-over switch 30 connects the terminal a 30a or terminal b 30b to the antenna with a signal inputted to the change-over terminal control.

Figure 8:
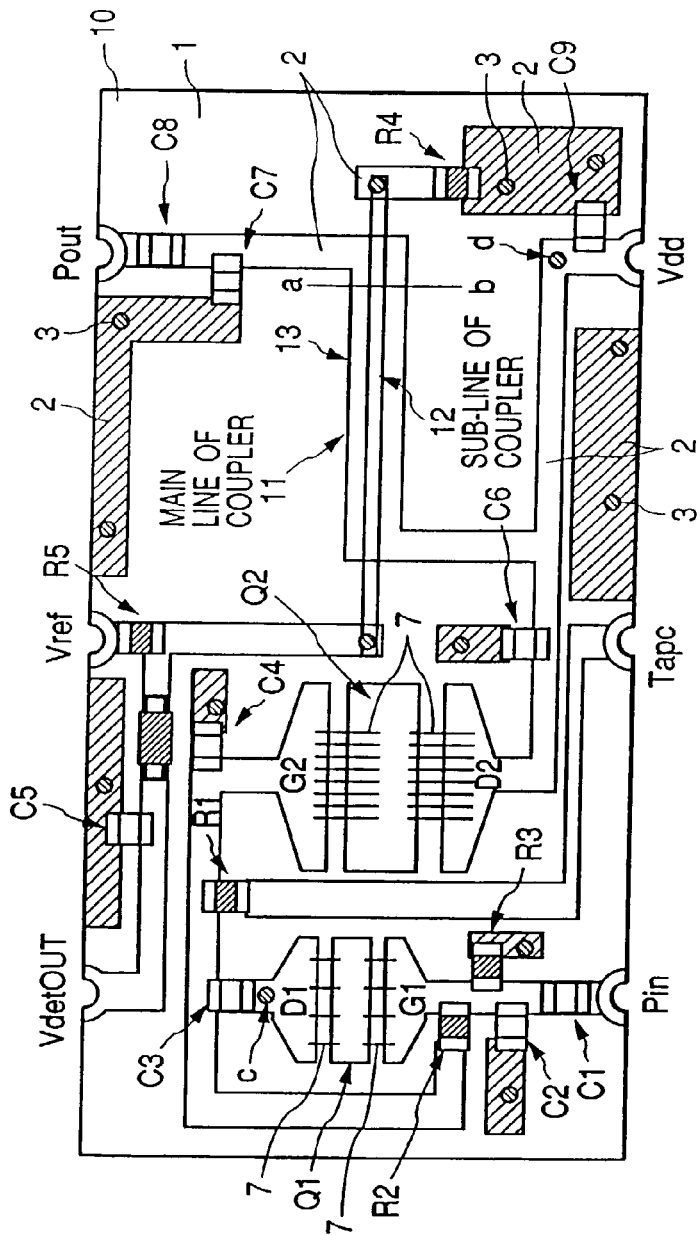
FIG. 8 is a schematic plan view of the layout of electronic parts on the surface of the wiring substrate (dielectric material substrate) in the high frequency circuit module.

The high frequency circuit module 20 has the external appearance of flat rectangular body structure wherein a cap is overlapped on the upper surface of the wiring substrate 10 (refer to FIG. 8). Moreover, an external electrode terminal is provided at the area extending to the side surface from the lower surface of the wiring substrate, setting up the surface mounting type.

Figure 7:
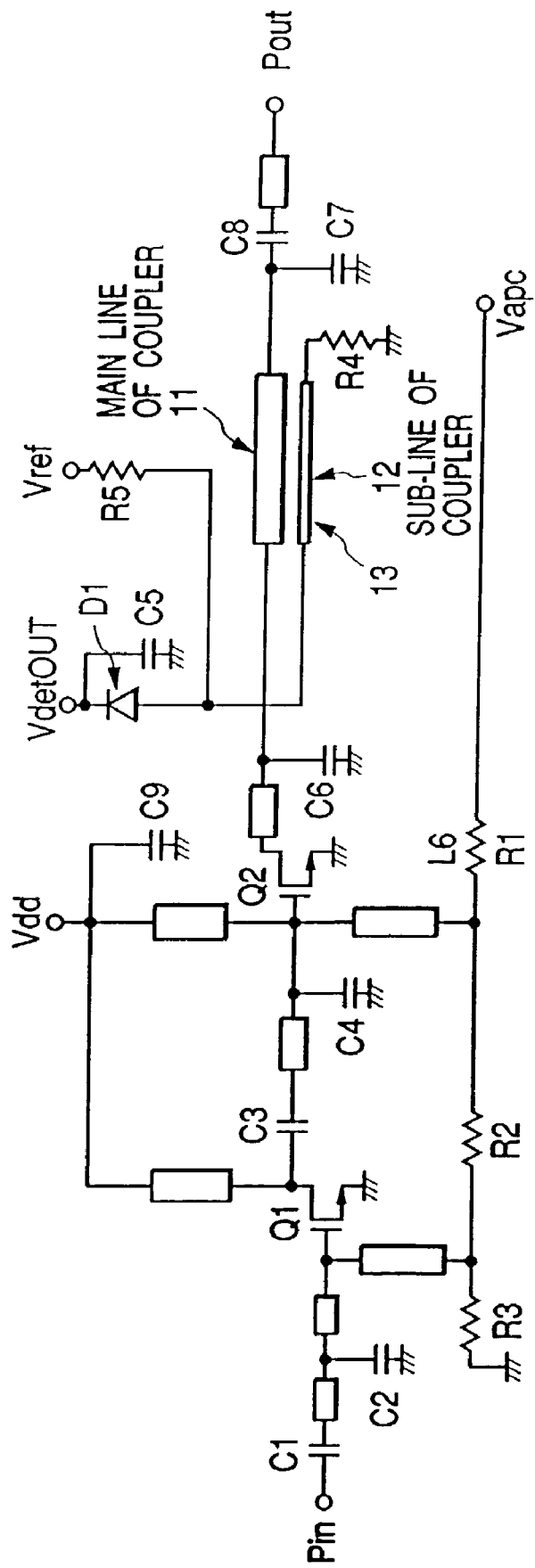
FIG. 7 is a circuit diagram of the high frequency circuit module.

As illustrated in FIG. 6 to FIG. 8, the external electrode terminal includes an input terminal Pin, an output terminal Pout, a control terminal Vapc, a power detection terminal VdetOUT, a reference potential terminal Vref, a power supply potential terminal Vdd and a reference potential terminal GND.

A signal is supplied to PA25 from the input terminal Pin and an output is outputted to the output terminal Pout. The output line part of PA25 comprises a directional coupler 13. Namely, the sub-line 12 is allocated for the main line or first line 11 connected to PA25 and one end of this sub-line or second line 12 is connected to the power detection terminal VdetOUT, while the other end to the reference potential terminal Vref via a resistor R.

The high frequency transmission signal and control signal are transmitted from the high frequency signal processing IC 26, the high frequency transmission signal is supplied to the input terminal Pin of the high frequency circuit module 20, while the control signal is supplied to CPU 27. The power control signal outputted from CPU 27 is supplied to the APC circuit (APC) 28.

The APC circuit 28 receives the power control signal and the power detection signal from the power detection terminal VdetOUT and supplies the control signal to the control terminal Vapc. This control signal is supplied to PA25 and thereby the power of PA25 is controlled with the control signal. PA25 has a plurality of amplifying stages and the control signal is supplied to each amplifying stage to amplify the signal with the power depending on the control signal.

For the transmission, the terminal a 30a of the transmission/reception change-over switch 30 is connected to the antenna 31 with the change-over signal from the change-over terminal control and thereby the electromagnetic wave is radiated from the antenna 31. For the reception, the terminal b 30b of the transmission/reception change-over switch 30 is connected to the antenna 31 and the receiving signal received with the antenna 31 is supplied to the high frequency signal processing IC 26.

FIG. 7 is a circuit diagram of the high frequency circuit module 20. As illustrated in FIG. 7, a plurality of transistors (for example, field effect transistors) are sequentially cascade-connected between the input terminal Pin and output terminal Pout to form an amplifying system (amplifying stage) of the multiple stage structure. In this embodiment, although not particularly limited, the cascade-connected transistors have the two-stage structure comprising the initial stage transistor (initial stage amplifying stage) Q1 and the final stage transistor (final stage amplifying stage) Q2. At the output line part of the final stage amplifying stage, a directional coupler 13 is formed of the main line (coupler main line) 11 and sub-line (coupler sub-line) 12.

The control terminal Vapc is connected to the gate electrode (first terminal) of each transistor Q1, Q2 via voltage-dividing resistors R1, R2 and R3. The power supply potential terminal Vdd is respectively connected to the drain electrode (second terminal) and gate electrode of each transistor Q1, Q2 under the condition that the potential is stabilized with the bias capacitor C9. The control voltage Vapc supplied from the APC circuit 28 is divided with a voltage dividing resistor and is then supplied to the gate of each transistor. Accordingly, the bias voltage of each transistor varies depending on the control voltage Vapc to change the amplification factor of each transistor. Namely, the power of PA25 varies depending on the value of control voltage Vapc.

One end of the sub-line 12 of the directional coupler 13 is connected to the reference potential terminal Vref via the resistor R5 and is also connected to the power detection terminal VdetOUT via a diode D1. In this circuit, the capacitors C1 to C9 and resistor R4 are also provided in the matching circuit and various points of the circuit in order to maintain the potential. Moreover, the rectangular part in FIG. 7 indicates a micro-strip line. An output of PA25 is supplied to the coupler main line 11, a detection signal is outputted from the coupler sub-line depending on the output of PA25 and this output is supplied to the power detection terminal VdetOUT.

Figure 9:
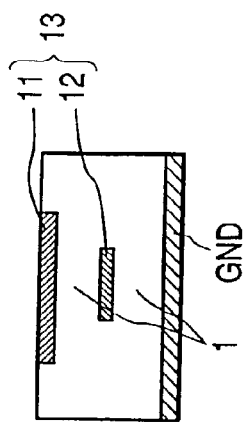
FIG. 9 is a cross-sectional view illustrating a directional coupler part in the high frequency circuit module.
Figure 10:
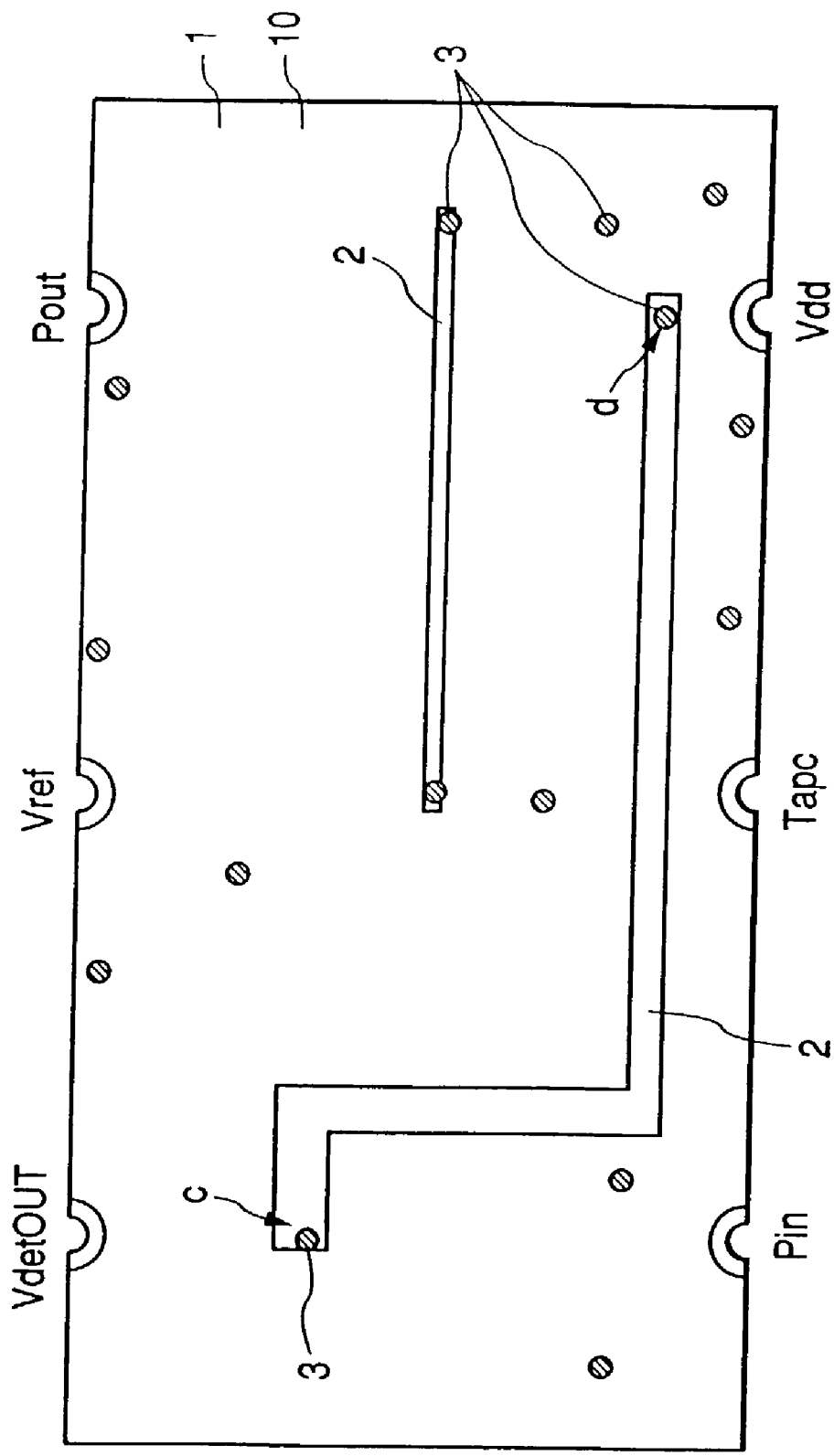
FIG. 10 is a diagram illustrating a conductor pattern of the internal layer of the wiring substrate.

FIG. 8 is a plan view of the wiring substrate 10, indicating the layout pattern of the conductive layer 2 and conductor 3 and the mounting condition of each electronic part. Each electrode of the transistors Q1 Q2 is electrically connected to the predetermined conductive layer 2 via the wire 7. FIG. 10 illustrates a pattern of the conductive layer 2 of the internal layer of the wiring substrate 10, namely a pattern of the sub-line 12 or the like. FIG. 9 illustrates a cross-section of the part along the line a-b of FIG. 8, namely a directional coupler 13. Width of the main line 11 as the transmission line is set wider than that of the sub-line 12 as the detection line. Moreover, both side edges of the sub-line 12 are not extruded from both side edges of the main line 11 and are allocated in the internal side thereof. Therefore, an output current can surely be detected.

This embodiment 1 provides the following effects.
(1) In the overlapping type directional coupler 13 of the high frequency circuit module 20, both side edges of the sub-line 12 are located in the internal side of both side edges of the main line 11 and the width of the main line 11 is set wider than the width of the sub-line 12. Therefore, the total area of the sub-line 12 is surely provided opposing to the main line 11 and thereby the power can be detected with higher accuracy.
(2) The sub-line 12 is restricted to be located within the width of the main line 11, but the width of the main line 11 is not limited. Accordingly, the width of the main line 11 can be selected freely. Therefore, the loss reducing effect can be realized by widening the width of the main line and utilizing the main line as a matching element. Namely, an impedance of the main line can be lowered and lowering the loss in the line up to the filter 29 from PA25 by widening the width of the main line. As a high frequency circuit module to be comprised in the wireless communication system, the main line can be comprised as a part of the matching element and thereby the part reducing and loss reducing effects can also be attained.

(Embodiment 2)

Figure 11:
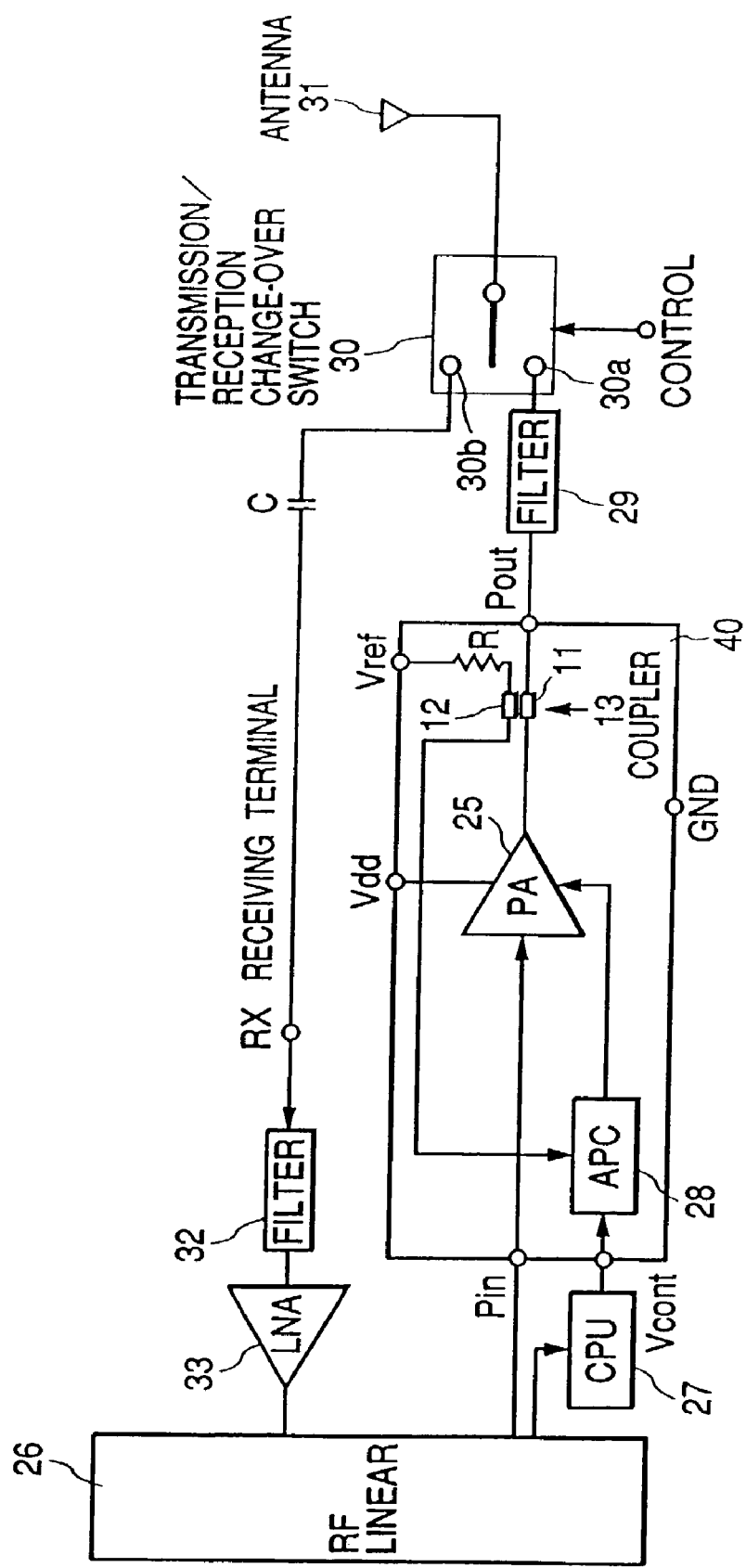
FIG. 11 is a block diagram illustrating a part of the wireless communication system comprising the high frequency circuit module of the other embodiment (embodiment 2) of the present invention.

FIG. 11 is a block diagram illustrating a part of the wireless communication system comprising a high frequency circuit module of the other embodiment (embodiment 2) of the present invention. FIG. 11 is also a block diagram illustrating a part of the wireless communication system as in the case of the embodiment 1, including the elements up to the antenna 31 from the high frequency signal processing IC (EF linear) 26.

The embodiment 2 has a structure that the high frequency circuit module 40 comprises a high frequency power amplifier (PA) 25, a direction coupler 13 and an APC circuit (APC) 28. Namely, APC 28 is added to the high frequency circuit module 20 of the embodiment 1.

Therefore, the power detection signal as an output of the directional coupler 13 is supplied to APC 28 and the external electrode terminal as the power detection terminal is unnecessary. Moreover, since the control signal as an output of APC28 is supplied to PA25 in the high frequency circuit module 40, the control terminal is also unnecessary. Instead, the power control terminal Vcont is newly required to input the power control signal as an output of CPU27.

Accordingly, the external electrode terminal include an input terminal Pin, an output terminal Pout, a, power control terminal Vcont, a reference potential terminal Vref, a power supply potential terminal Vdd and a reference potential terminal GND.

The directional coupler 13 is of an overlapping type directional coupler having the structure similar to that of the embodiment 1. Namely, the directional coupler 13 for detecting an output of the high frequency circuit module 40 has a structure where the main line or first line 11 and sub-line or second line 12 are overlapped via a dielectric material. In this case, the width of the sub-line 12 is set narrower than that of the main line 11 and both side edges of the sub-line 12 are located in the internal side of both side edges of the main line 11.

Therefore, since the sub-line 12 is provided opposed, in the total line area, to the main line 11, an output current flowing the main line 11 can surely be detected with higher accuracy. Moreover, the sub-line 12 is limited to be located within the width of the main line 11 but since the main line 11 is not limited in its width, the width of the main line 11 can be selected freely.

Therefore the wireless communication system that is controlling an output of the high frequency circuit module 40 by comprising such directional coupler 13 assures stable communication.

(Embodiment 3)

Figure 12:
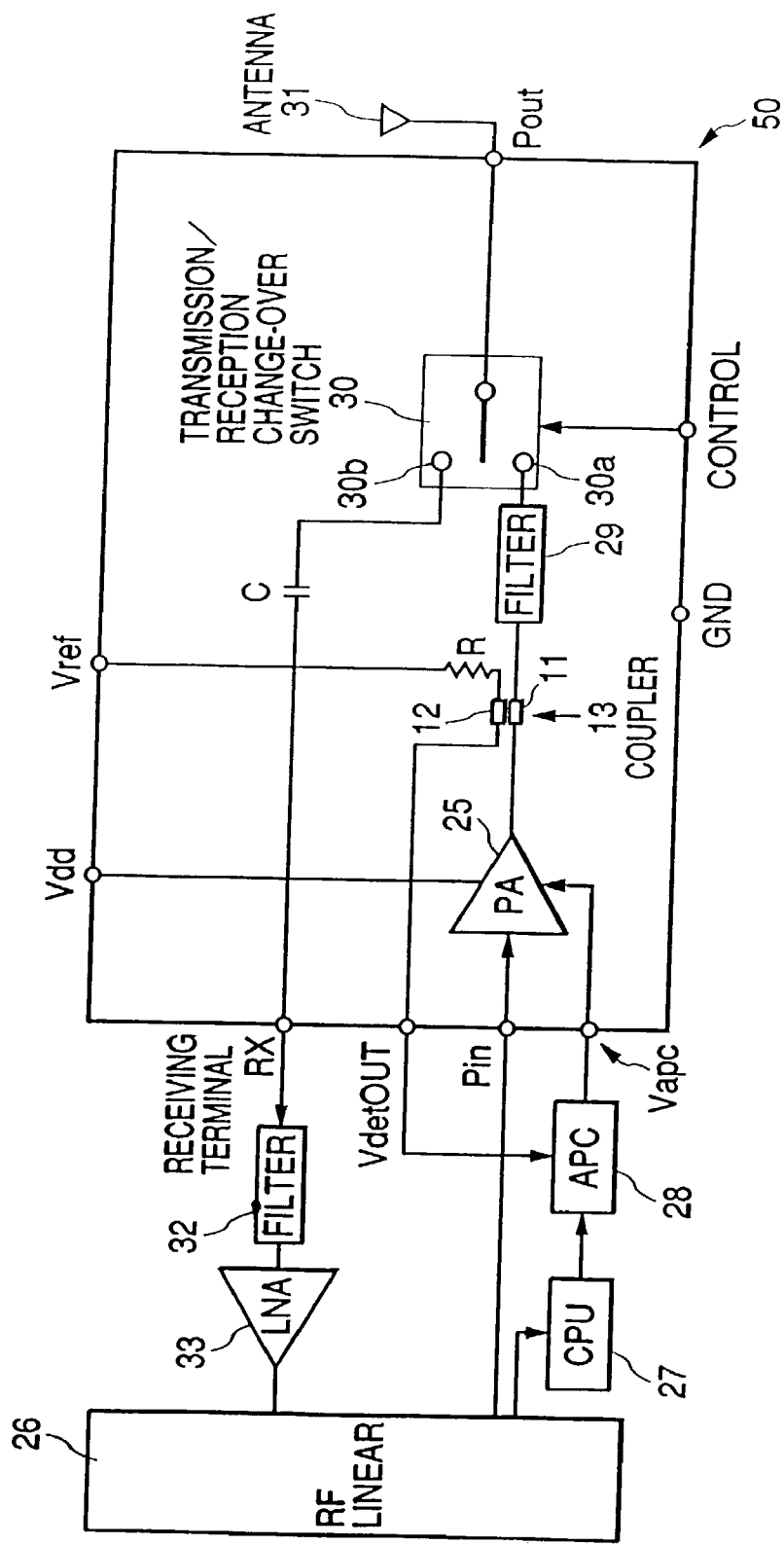
FIG. 12 is a block diagram illustrating a part of the wireless communication system comprising the high frequency circuit module as the other embodiment (embodiment 3) of the present invention.

FIG. 12 is a block diagram illustrating a part of the wireless communication system comprising the high frequency circuit module as the other embodiment (embodiment 3) of the present invention. FIG. 12 is a block diagram illustrating a part of the wireless communication system as in the case of the embodiment 1, including the elements up to the antenna 31 from the high frequency signal processing IC (RF linear) 26.

The embodiment 3 has a structure wherein the high frequency power amplifier (PA) 25, directional coupler 13, filter 29 and antenna switching circuit are comprised in the high frequency circuit module 50. Namely, in this circuit, the filter 29 and antenna switch circuit are added to the high frequency circuit module 20 of the embodiment 1.

Therefore, the external electrode terminal includes a receiving terminal Pin, an output terminal Pout connected to the transmission/reception change-over switch 30, a receiving terminal RX, a control terminal Vapc, a reference potential terminal Vref, a power detection terminal VdetOUT, a change-over terminal control, a power supply potential terminal Vdd and a reference potential terminal GND.

The directional coupler 13 is of the overlapping type directional coupler in the structure similar to that of the embodiment 1. Namely, the directional coupler 13 for detecting an output of the high frequency circuit module 50 is formed in the structure that the main line or first line 11 and sub-line or second line 12 are overlapped via the dielectric material. In this structure, the sub-line 12 is set narrower, in its width, than the width of the main line 11 and both side edges of the sub-line 12 are allocated at the internal side of both side edges of the main line 11.

Therefore, since the sub-line 12 is provided opposed, in its total width, to the main line 11, a current output flowing into the main line 11 can surely be detected with higher accuracy.

Moreover, the sub-line 12 is limited to be located within the line width of the main line 11, but since the main line 11 is not limited in its width, the line width of the main line 11 can be selected freely.

The wireless communication system in which the comprised directional coupler 13 controls an output of the high frequency circuit module 50 assures stable communication.

(Embodiment 4)

Figure 13:
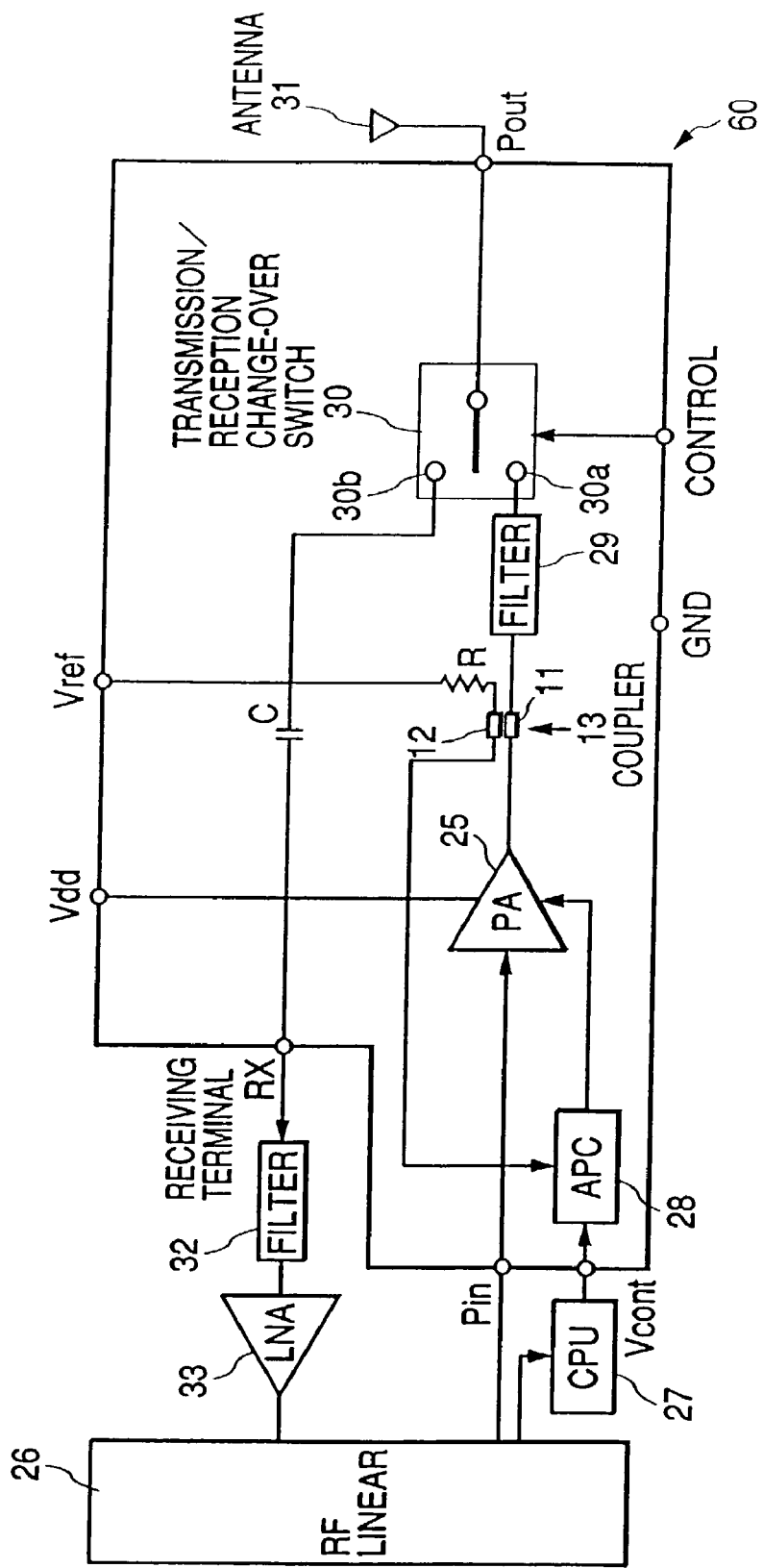
FIG. 13 is a block diagram illustrating a part of the wireless communication system comprising the high frequency circuit module as the other embodiment (embodiment 4) of the present invention.

FIG. 13 is a block diagram illustrating a part of the wireless communication system comprising a high frequency circuit module as the other embodiment (embodiment 4) of the present invention. FIG. 12 is the block diagram illustrating a part of the wireless communication system as in the case of the embodiment 1, including the elements up to the antenna 31 from the high frequency signal processing IC (RF linear) 26.

This embodiment 4 has a structure that a high frequency power amplifier (PA) 25, a directional coupler 13, an APC circuit 28, a filter 29 and an antenna switching circuit are comprised in the high frequency circuit module 60. Namely, the APC circuit 28 is added to the high frequency circuit module of the embodiment 3.

Therefore the external electrode terminal includes the input terminal Pin, output terminal Pout connected to the transmission/reception change-over switch 30, receiving terminal RX, power control terminal Vcont, reference potential terminal Vref, change-over terminal control, power supply potential terminal Vdd and reference potential terminal GND.

The directional coupler 13 is the overlapping type directional coupler in the structure similar to that of the embodiment 1. Namely, the directional coupler 13 for detecting an output of the high frequency circuit module 60 has a structure where the main line or first line 11 and the sub-line or second line 12 are overlapped through a dielectric material. The sub-line 12 is narrower in the width than the main line 11 and both side edges of the sub-line 12 are allocated at the internal side of both side edges of the main line 11.

Therefore, since the sub-line 12 is provided opposed to the main line 11 in the total width, an output current flowing in the main line 11 can surely be detected with higher accuracy.

Moreover, the sub-line 12 is limited to be located within the line width of the main line 11, but since the main line 11 is not limited in its width, the width of the main line 11 can be selected freely.

Therefore, the wireless communication system for controlling an output of the high frequency circuit module 60 comprising such directional coupler 13 assures stable communication.

(Embodiment 5)

Figure 14:
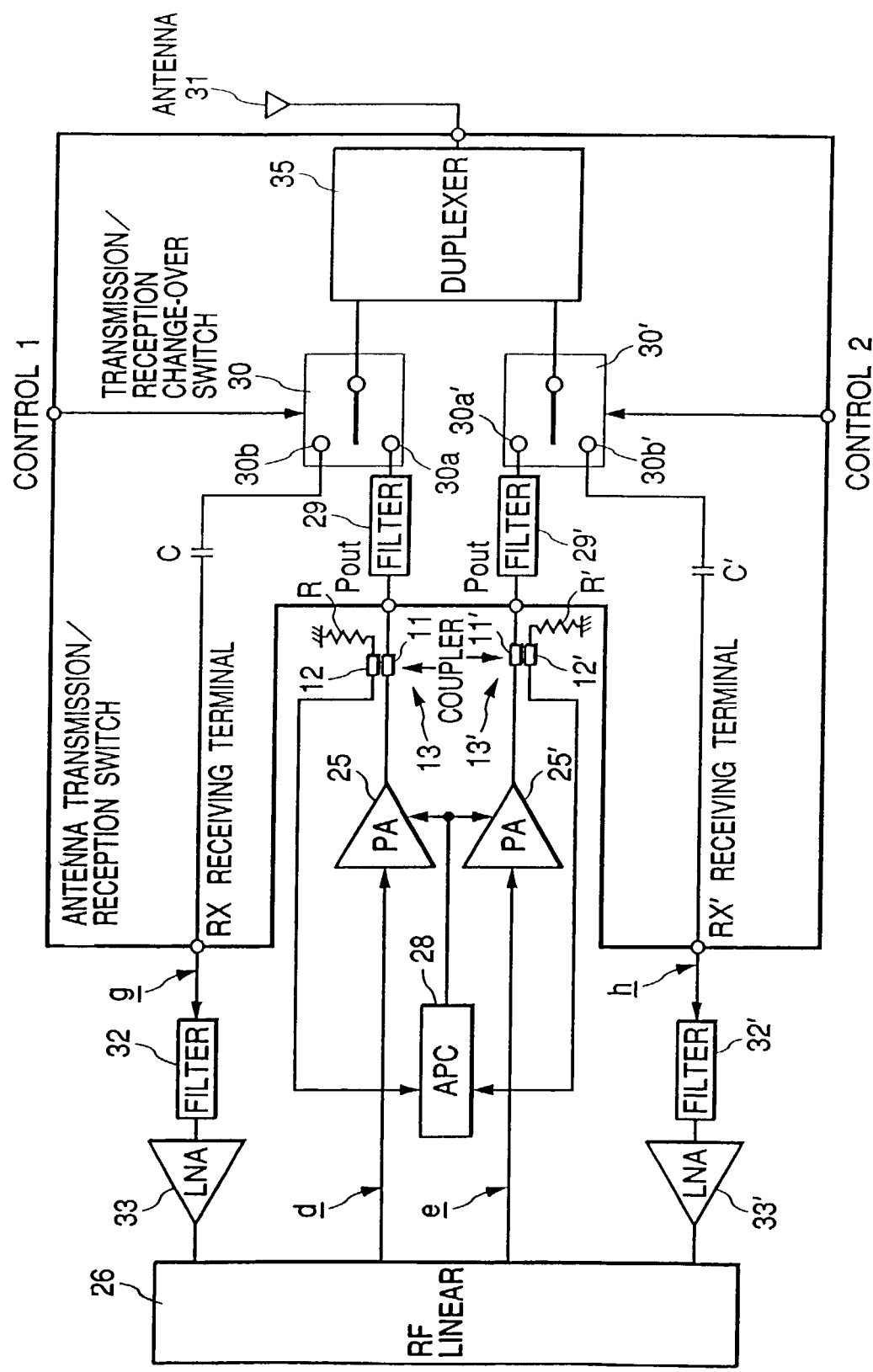
FIG. 14 is a block diagram illustrating a part of the wireless communication system comprising a dual-band communication type high frequency circuit module of the other embodiment (embodiment 5) of the present invention.

FIG. 14 is a block diagram illustrating a part of the wireless communication system comprising the high frequency circuit module of the dual band communication system as the other embodiment (embodiment 5) of the present invention. FIG. 14 is a block diagram illustrating a part of the wireless communication system like the embodiment 1 including the elements up to the antenna 31 from the high frequency signal processing IC 26 (RF linear).

The dual band communication system has a couple of communication systems (transmitting system d and receiving system g, transmitting system e and receiving system h). The transmitting systems d, e and receiving systems g, h are almost identical to those of the embodiment 1 but the transmission/reception change-over switches 30, 30' of these two communication systems are connected to the duplexer 35 which is connected with the antenna 31. Moreover, in the two transmitting systems d, e, only one APC circuit 28 is used in common. One communication system (transmitting system d and receiving system g) is designated with the same code as that of FIG. 6 of the embodiment 1, while the other communication system (transmitting system e and receiving system h) is designated with the code given the apostrophe (').

In such a wireless communication system, the high frequency module can employ any structure of the embodiment 1 to embodiment 4. The two transmitting systems d, e in the high frequency circuit module of each structure comprise the directional coupler 13 of the structure explained regarding the embodiment 1.

Namely, the respective directional couplers 13, 13' in the two transmitting systems d, e detect outputs of the high frequency power amplifiers (PA) 25, 25'. The main lines or first lines 11, 11' and the sub-lines or second lines 12, 12' of the directional couplers 13, 13' are overlapped via the dielectric material. Moreover, the sub-lines 12, 12' are narrower in the width than the main lines 11, 11' and both side edges of the sub-lines 12, 12' are allocated at the internal side of both side edges of the main lines 11, 11'.

Therefore, since the sub-lines 12, 12' are provided opposed to the main lines 11, 11' in the total width area, an output current flowing into the main lines 11, 11' can surely be detected with higher accuracy.

Moreover, the sub-lines 12, 12' are limited to be located within the width of the main lines 11, 11' but since the main lines 11, 11' are not limited in the line width, the width of the main lines 11, 11' can be selected freely.

Therefore, the wireless communication system for controlling an output of the high frequency circuit module by comprising such directional couplers 13, 13' assures stable communication.

(Embodiment 6)

Figure 15:
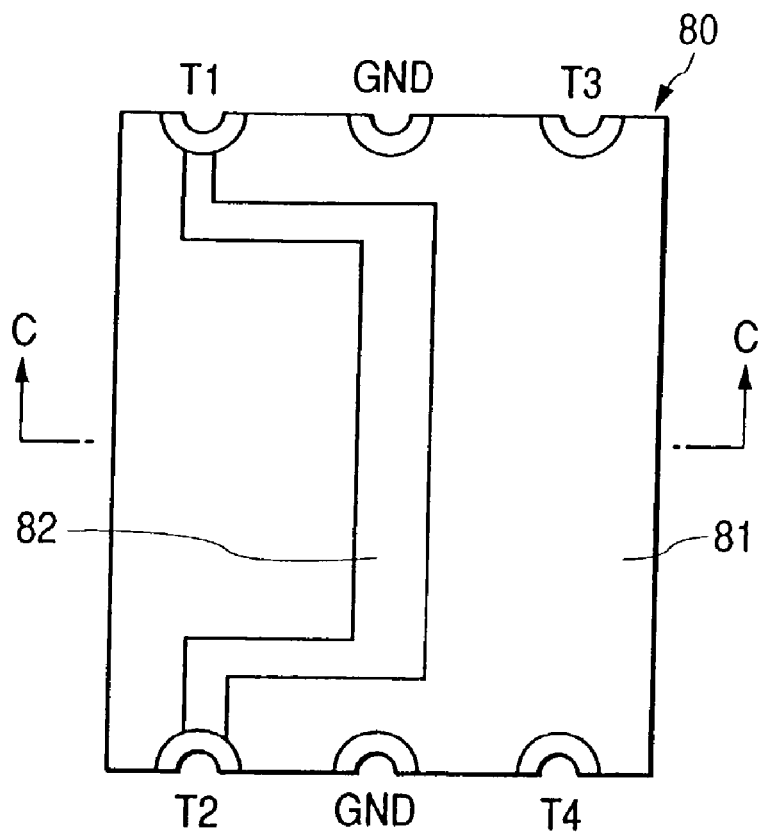
FIG. 15 is a plan view of the overlapping type coupler of the other embodiment (embodiment 6) of the present invention.
Figure 16:
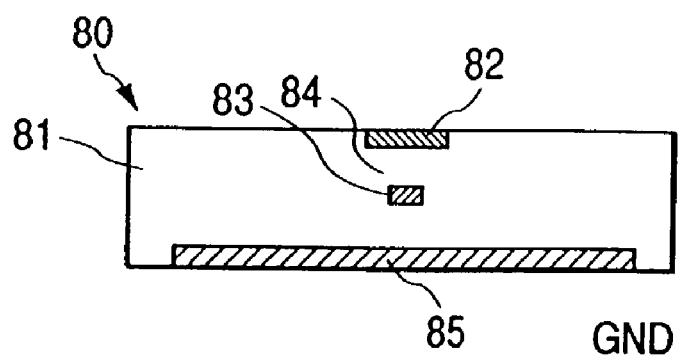
FIG. 16 is a cross-sectional view along the line C—C of FIG. 15.
Figure 17:
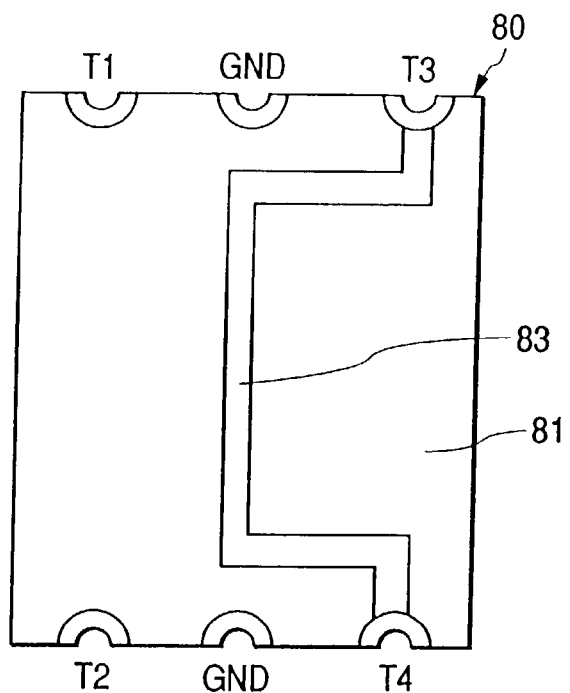
FIG. 17 is an internal layer pattern diagram of the overlapping type coupler of the embodiment 6.
Figure 18:
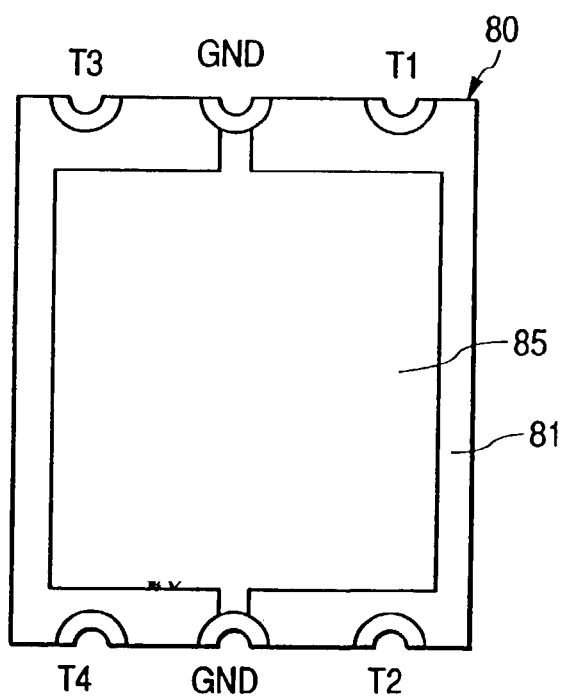
FIG. 18 is a bottom view illustrating the rear surface of the overlapping type coupler of the embodiment 6.

FIG. 15 to FIG. 16 illustrate an overlapping type coupler and the other embodiment (embodiment 6) of the present invention. FIG. 15 is a plan view of the overlapping type coupler. FIG. 16 is a cross-sectional view along the line C—C in FIG. 15. FIG. 17 illustrates an internal layer pattern of the overlapping type coupler. FIG. 18 is a bottom view illustrating the rear surface of the overlapping type coupler.

The overlapping type coupler 80 has a structure that the main line or the first 82 and the sub-line or second line 83 are allocated in the manner that these are partly overlapped in the predetermined length via the dielectric material layer 84 at the front surface of the dielectric material substrate 81 and in the intermediate substrate. Moreover, the bottom surface of the dielectric material substrate 81 is provided with the ground layer (GND) 85.

As illustrated in FIG. 15, the dielectric material substrate 81 is provided at both ends with external electrode terminals. The external electrode terminal is of the surface mounting type including T1, GND, T3 provided at one end of the dielectric material substrate 81 and T2, GND and T4 provided at the other end thereof.

The overlapping portion of the main line 82 and sub-line 83 is provided along the center line of the dielectric material substrate 81 as illustrated in FIG. 15 to FIG. 17. Therefore, the terminals of the main line 82 and sub-line 83 are respective biased to the minus side and the other side of the dielectric material substrate 81. The terminals of the main line 82 as the transmitting line are T1 and T3. Moreover, the terminals of the sub-line 83 as the detection line are T2 and T4. GND is provided at the center. The main line 82 and sub-line 83 may introduce the inverse structure.

The line widths of the main line 82 and sub-line 83 that are provided in the overlapping manner are different from each other and the width of the main line 82 is wider than that of the sub-line 83. The sub-line 83 is narrower in the width than the main line 82 and both side edges of the sub-line 83 are located at the internal side of both side edges of the main line 82. For example, at the time of forming the lines, the center line of the main line 82 is matched with the center line of the sub-line 83. Accordingly, a current flowing into the main line 82 can surely be detected.

Since the width of main line 82 is wider than that of the sub-line 83, the width of the main line 82 can be selected freely. On the occasion of mutual connection of the electronic parts, the impedance matching is conducted. An impedance value for impedance matching is not particularly limited but 50Ω, for example, is often used. According to the present embodiment, the impedance value of the main line 82 can be set lower than 60Ω. When the impedance value of the main line is set to a lower value, a loss generated between the amplifier PA and antenna can be reduced.

In this embodiment, the overlapping type coupler (directional coupler) has been explained but the present invention is not limited thereto and may also be applied to a parallel type. Namely, the present invention can also be applied to a structure where the main line and sub-line are allocated in parallel at the surface of the dielectric material substrate having GND at the rear surface. In this case, the widths of the main line and sub-line are different from each other. For example, the width of main line is set wider than that of the sub-line. According to this structure, it is possible to obtain the predetermined impedance by freely selecting the width of main line. For example, it is also possible to set the impedance of the sub-line to 50Ω considering the connection with the APC circuit and to set the impedance of the main line to a lower value in order to reduce a loss.

(Embodiment 7)

Figure 19:
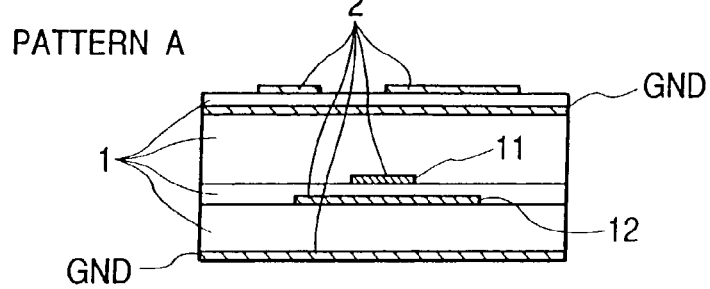
FIG. 19 is a cross-sectional view of the part crossing the line of overlapping type coupler in the high frequency circuit module of the other embodiment (embodiment 7) of the present invention.
Figure 20:
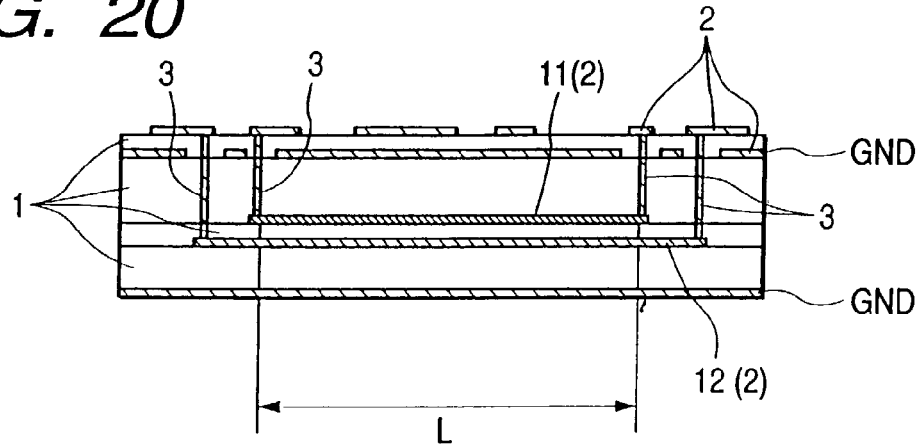
FIG. 20 is a cross-sectional view of the part along the line of the overlapping type coupler of the embodiment 7.
Figure 21:
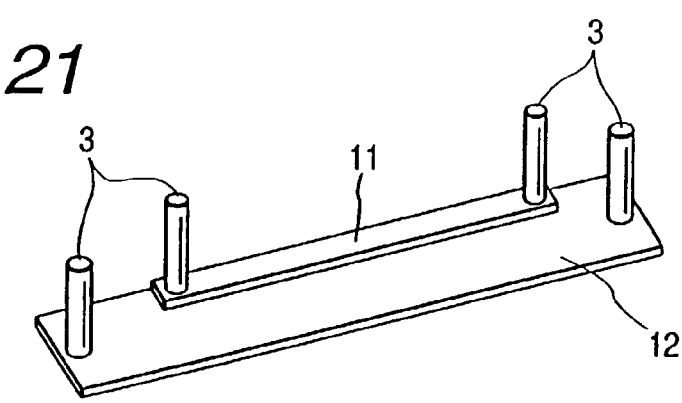
FIG. 21 is a schematic diagram illustrating the relationship between the main line and sub-line of the overlapping type coupler of the embodiment 7.
Figure 23:
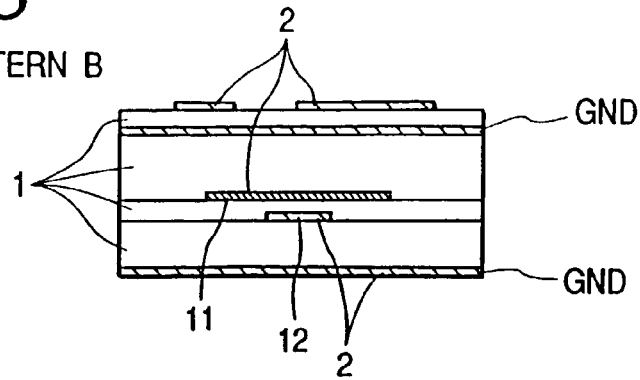
FIG. 23 is a cross-sectional view illustrating the other overlapping type coupler (pattern B).
Figure 24:
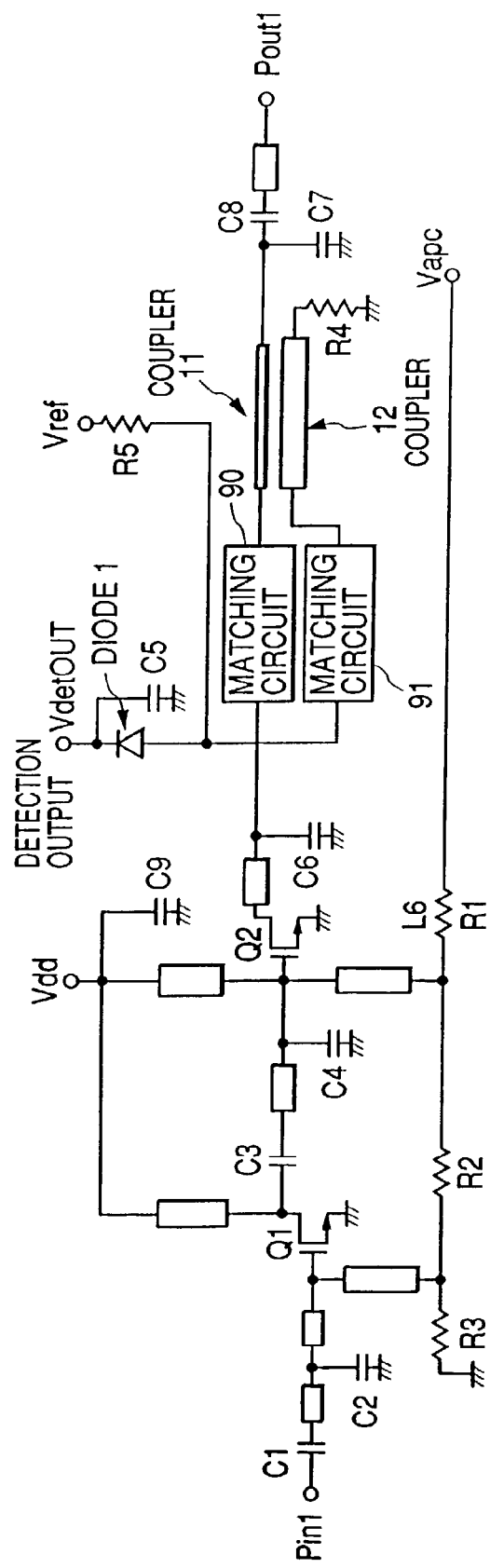
FIG. 24 is a circuit diagram of the high frequency circuit module of the embodiment 7.
Figure 25:
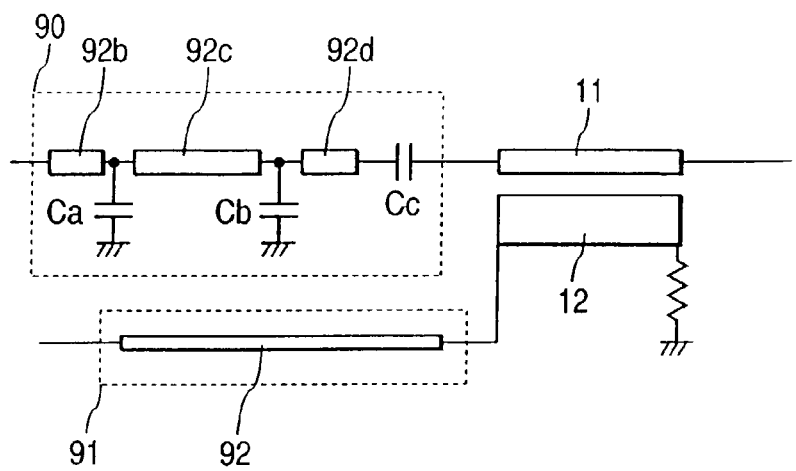
FIG. 25 is a circuit diagram including a matching circuit for the main line and sub-line.
Figure 26:
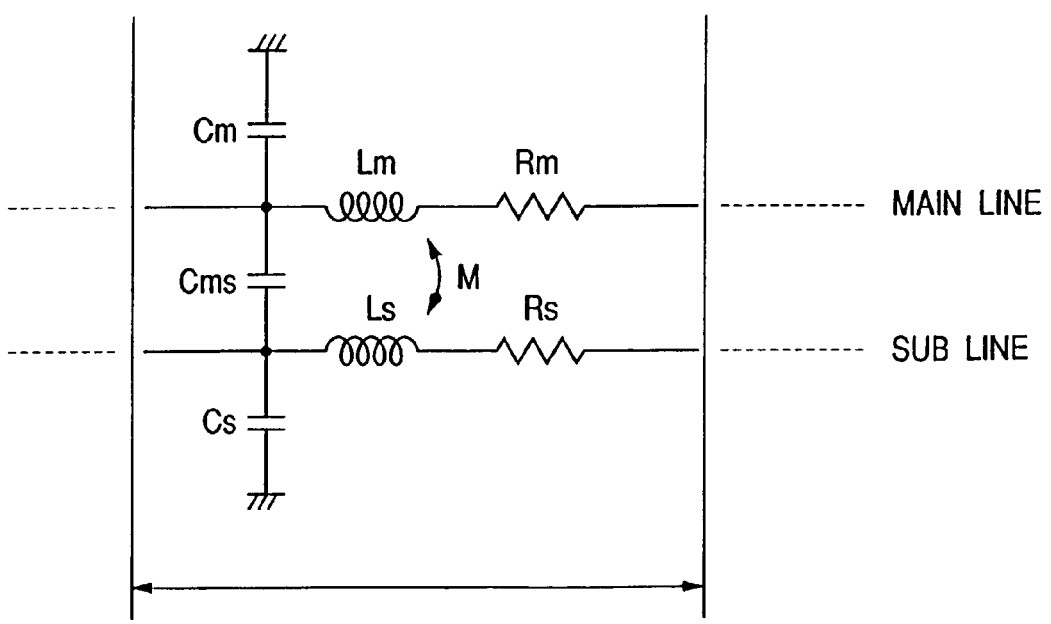
FIG. 26 is an equivalent circuit diagram illustrating the matching circuit of the main line and sub-line.

FIG. 19 to FIG. 27 are diagrams in relation to the high frequency circuit module of the other embodiment (embodiment 7) of the present invention. FIG. 19 to FIG. 21 are diagrams illustrating structures of the overlapping type coupler. FIG. 22 is a characteristic diagram indicating the coupling efficiency. FIG. 24 to FIG. 26 are circuit diagrams. FIGS. 27(A) and 27(B) are schematic diagrams illustrating the field distribution of the coupler.

The high frequency circuit module of the embodiment 7 corresponds to that of the embodiment 1 wherein the main line width of the overlapping type coupler is set narrower than the sub-line width. Namely, this high frequency circuit module comprises an amplifying system comprising a plurality of amplifying stages including at least the initial stage and the final stage and a directional coupler for detecting an output of the final stage of the amplifying system. In this case, the width of the main line forming the transmitting line of the directional coupler is set narrower than the width of the sub-line forming the detection line. The directional coupler is of the overlapping type coupler, wherein both side edges of the main line, in the main line and sub-line that are provided in the overlapping manner, are not extruded to the external side from both side edges of the sub-line and are allocated within the internal side thereof and the main line is surely overlapped on the sub-line. Since an impedance of the main line is set larger than that of the sub-line because the width of main line is narrower than the width of the sub-line and since the impedance of main line forming the coupler becomes high, a matching circuit for impedance matching is provided, in this embodiment, between the main line and the final amplifying stage in order to realize impedance matching with the amplifying stage. Moreover, a matching circuit for attaining impedance matching to a device for detecting a current of the sub-line is also provided between the sub-line and output end of the sub-line.

FIG. 24 illustrates the circuit of the high frequency circuit module of this embodiment. FIG. 24 is different from the circuit of FIG. 7 in such a point that the width of main line or first line 11 is set narrower (short) than the width of the sub-line or second line 12. Moreover, a matching circuit 90 for impedance matching is intentionally provided between the main line 11 and the final amplifying stage Q2. Moreover, a matching circuit 91 for impedance matching with a device for detecting a current of the sub-line is also provided between the sub-line 12 and the output end of the sub-line 12, namely the power detection terminal VdetOUT. Other structures are identical to that of the embodiment 1.

FIG. 19 to FIG. 21 illustrate the relationship between the main line 11 and the sub-line 12. As illustrated in FIG. 19 and FIG. 20, an integrated wiring substrate (module substrate) is structured by laminating and sintering a plurality of dielectric material plates 1 on which the conductive layers are printed. The wiring and the main line and sub-line 12 forming the overlapping type coupler are formed of the conductive layers 2. In addition, the through-holes provided through the predetermined dielectric material plate 1 are filled with conductor 3 to electrically connect the upper and lower conductive layers. Moreover, the ground (GND) wiring layer is formed of the conductive layer 2 between the predetermined dielectric material plates 1 and at the lower surface of the lower most dielectric material plate 1.

As illustrated in FIG. 19 and FIG. 21, the main line 11 and sub-line 12 are mutually overlapped. The main line 11 is formed narrower (shorter) in the width than the sub-line 12 and both side edges of the main line are allocated at the internal side of both side edges of the sub-line 12. Accordingly, the coupling area between the main line 11 and sub-line 12 can be kept constant even if overlapping is fluctuated due to the fluctuation of manufacturing conditions. In FIG. 20, L designates the coupling length. FIG. 21 is a schematic diagram of the main line 11 and sub-line 12 where the dielectric material plate 1 is omitted to make clear the layout of the main line 11 and sub-line 12.

As illustrated in FIG. 25, a matching circuit 91 connected to the sub-line 12 is formed of a micro-strip line 92 and a matching circuit 90 connected to the main line 11 is formed of the micro-strip lines 92b to 92d and capacitors Ca to Cc.

In the embodiment 7, the coupling coefficient may be increased by shortening (narrowing) the width of main line 11 than that of the sub-line 12. As a result, the overlapping length (coupling length L) of the main line and sub-line can be shortened to realize reduction in size of the high frequency circuit module. In addition, since the coupling length L can be shortened, if the width of line is comparatively narrower, a loss of the signal passing the main line 11 can be reduced.

FIG. 22 is a characteristic diagram illustrating correlation between the coupling length L and coupling efficiency (dB). The pattern A corresponding to the embodiment 7 illustrated in FIG. 19 to FIG. 21, while the pattern B corresponds to the overlapping type coupler of the structure where the width of main line 11 is wider than that of the sub-line 12. As will be understood from FIG. 22, the coupling coefficient of the pattern A is higher than that of the pattern B. For example, in case the coupling coefficient is −15 dB, the length of about 3.5 mm is required as the coupling length in the pattern B, while in the pattern A, only the length of about 2.5 mm is required as the coupling length L and thereby the coupling length L can be reduced by about 1 mm.

The characteristic diagram of FIG. 22 has been obtained through the simulation. As illustrated in this figure, the pattern A can be assumed to be superior to the pattern B because of the following reasons. The coupler can be expressed as an equivalent circuit having the distribution constant of the element shown in FIG. 26 in the small section ΔX. The main line is formed of an inductance Lm and a resistance Rm, while the sub-line is formed of an inductance Ls and a resistance Rs. A parasitic capacitance Cms is generated between the main line and sub-line, a parasitic capacitance Cm is generated between the main line and the ground and a parasitic capacitance Cs is generated between the sub-line and the ground. Moreover, a mutual inductance M is generated between the main line and sub-line.

In the case of the overlapping type coupler where the coupling length is L, although not particularly specified, above characteristic diagram can be obtained by solving the predetermined differential equation with the condition of lim ΔX→0 in the section (0≦X≦L. The coupling coefficient is influenced with the parasitic capacitances and mutual inductance M.

The field distribution in the case where attention is paid to the parasitic capacitance Cm is illustrated in FIG. 27. FIG. 27(a) illustrates the pattern A based on the embodiment 7 where the width of the main line 11 is narrower than that of the sub-line 12 and FIG. 27(b) illustrates the case where the width of main line 11 is wider than that of the sub-line 12 (pattern B: in the case of FIG. 23).

In the case of the embodiment 7 (pattern A) illustrated in FIG. 27(a), since the width of the sub-line 12 is sufficiently wider than that of the main line 11, the electric field directed to the GND wiring side in the lower side from the main line 11 almost reaches the sub-line 12. Meanwhile, in the pattern B illustrated in FIG. 27(b), the width of sub-line 12 is narrower than that of the main line 11 and both sides of main line 11 are extended up to the external side of the sub-line 12. Therefore, the electric field directed toward the GND wiring at the lower side from the extruded portion does not reach the sub-line 12 but reaches the ground (GND) wiring at the lower side. As explained above, the rate of the electric field giving contribution to the coupling when the main line 11 is thin more increases than that when the main line 11 is thick (wide). Accordingly, a rate of the signal transferred to the sub-line via Cmos becomes large, resulting in the increase of the coupling coefficient.

However, the coupling coefficient drops only a little and it does not deteriorate, from the macroscopic viewpoint, the effect resulting from narrower width of the main line 11 than that of the sub-line 12 as in the case of the embodiment 1. In the embodiment 1, since it is possible to realize higher impedance of the sub-line, impedance matching between the sub-line and a circuit for detecting a current flowing into the sub-line can be realized easily. Therefore, a matching circuit provided before the detection diode may be eliminated or simplified.

Here, since the magnetic field due to the main line surrounding the sub-line changes only a little, the coupling due to the mutual inductance M can be thought to be little changed. Moreover, since the resistance Rm relates to a loss of the main line and the coupling coefficient of the unit length increases, the coupling length L to obtain the necessary coupling coefficient can be shortened and thereby a loss due to the resistance Rm can be reduced depending on the embodiment 7.

Even in this embodiment 7, since both side edges of the main line 11 are located at the internal side of both side edges of the sub-line 12, total area of the width of the sub-line 12 can surely be provided opposed to the main line 11 and thereby the power can be detected in higher accuracy.

In this embodiment, the overlapping type coupler (directional coupler) has been explained but the present invention is not limited thereto and it can also be applied to the parallel type coupler. Namely, it can also be applied to the structure where the main line and sub-line are allocated in parallel on the surface of the dielectric material substrate including GND at the rear surface. In this case, the width of the main line is different from that of the sub-line. For example, the width of the main line is wider than that of the sub-line. According to this structure, the width of main line can be selected freely to attain the predetermined impedance.

The present invention has been explained based on the preferred embodiments but the present invention is not limited only to above embodiments and naturally allows various changes and modification within the scope not departing from the subject matter thereof.

In above explanation, the present invention has been adapted to a wireless communication system such as a hand-held telephone set as the application field thereof but the present invention is not limited thereto and can also be adapted, for example, to a mobile communication apparatus such as a mobile telephone set or the like.

The effects which may be attained with the typical inventions disclosed in this specification are as follows.

(1) It is possible to provide a directional coupler that can detect the transmitting output of the main line in higher accuracy.

(2) It is possible to provide a high frequency circuit module including the directional coupler which can detect an output in higher accuracy.

(3) It is possible to provide a wireless communication system which can realize stable communication by monitoring an output in higher accuracy.

What is claimed is:

1. A high frequency circuit module, comprising:
    a semiconductor integrated circuit device including an amplifying stage; and
    a plurality of conductor layers,
    wherein a first conductor strip made by one layer of plurality of conductor layers and a second conductor strip made by another layer of the plurality of conductor layers are overlapped so that the first and second conductor strips form a power coupler,
    wherein the first conductor strip of the power coupler is coupled to an output terminal of the semiconductor integrated circuit device, and
    wherein the second conductor strip of the power coupler provides a power sense signal for controlling a power output level of the amplifying stage.

2. A high frequency circuit module, comprising:
    a wiring substrate being composed of a plurality of dielectric material layers and of a plurality of conductor layers, the plurality of dielectric material layers and the plurality of conductor layers being laminated so that each of two layers of the plurality of conductor layers being disposed at a top surface and a bottom surface of one dielectric material layer of the plurality of dielectric layers; and
    a semiconductor integrated circuit device mounted on the wiring substrate and including an output terminal and an amplifying stage and an output node thereof being coupled to the output temrinal,
    wherein a first strip made by a first layer of the plurality of conductor layers and a second strip being made by a second layer, which is another layer of the plurality of conductor layers, are overlapped so that the first strip and the second strip form a power coupler,
    wherein the first strip of the power coupler is coupled to the output terminal of the semiconductor integrated circuit device, and
    wherein the second strip of the power coupler provides a power sense signal for controlling a power output level of the amplifying stage.

3. A high frequency circuit module according to claim 2, further comprising:
    a circuit element to be coupled to the semiconductor integrated circuit device and placed on the wiring substrate,
    wherein the circuit element is coupled to the semiconductor integrated circuit device by using a third layer of the plurality of conductor layers.

4. A high frequency circuit module according to claim 3, wherein one of the plurality of dielectric material layers is placed between the first strip and the second strip.

5. A high frequency circuit module according to claim 4, wherein the circuit element includes one of a resistor and a capacitor.

6. A high requency circuit module according to claim 2, wherein one of the pluality of dielectric material layers is placed between the first strip and the second strip.

7. A high frequency circuit module according to claim 6, wherein a predetermined potential is applied to each of a fourth layer and a fifth layer of the plurality of conductor layers, the fourth layer and the fifth layer are different from each other and further different from the first and second layer, and the first strip and the second strip are placed between the fourth layer and the fifth layer.

8. A high frequency circuit module according to claim 6, further comprising:
    an antenna terminal;
    a receiving terminal; and
    an antenna switch circuit coupled to the antenna terminal, to the receiving terminal, and to the first conductor layer.

9. A high frequency circuit module according to claim 2, wherein the control signal from the second strip constitutes an output of a directional coupler.

10. A high frequency circuit module according to claim 2, wherein the width of the first strip is wider than the width of the second strip.

11. A high frequency circuit module according to claim 2, wherein the width of the second strip is wider than the width of the first strip.

12. A wireless communication system comprising:
    a wiring substrate being composed of a plurality of dielectric material layers and of a plurality of conductor layers, the plurality of dielectric material layers and the plurality of conductor layers being laminated so that each of two layers of the plurality of conducot layers being disposed at a top surface and a bottom surface of one dielectric material layer of the plurality of dielectric layers;
    a semiconductor integrated circuit device mounted on the wiring substrate and including an output terminal and an amplifying stage and an output node thereof being coupled to the output terminal;
    a power control circuit coupled to the amplifying stage and controlling a power of the amplifying stage according to a power control signal,
    wherein a first strip made by one layer of the plurality of conductor layers and a second strip being made by another layer of the plurality of conductor layers are overlapped so that the first strip and the second strip form a power coupler,
    wherein the first strip of the power coupler is coupled to the output terminal of the semiconductor integrated circuit device, and
    wherein the second strip of the power coupler provides a power sense signal for controlling a power output level of the amplifying stage.

13. A wireless communication system according to claim 12, further comprising:
    a circuit element to be coupled to the semiconductor integrated circuit device and placed on the wiring substrate,
    wherein the circuit element is coupled to the semiconductor integrated circuit device by using a third layer of the plurality of conductor layers.

14. A wireless communication system according to claim 12, wherein one of the plurality of dielectric material layers is placed between the first strip and the second strip.

15. A wireless communication system according to claim 14, wherein the circuit element includes on of a resistor and a capacitor.

16. A wireless communication system according to claim 12, wherein one of the plurality of dielectric material layers is placed between the first strip and the second strip.

17. A wireless communication system according to claim 16, wherein a predetermined potential is applied to each of a fourth layer and a fifth layer of the plurality of conductor layers, the fourth layer and the fifth layer are different from each other and further different from the first and second layer, and the first strip and the second strip are placed between the fourth conductor layer and the fifth conductor layer.

18. A wireless communication system according to claim 16, further comprising:
- an antenna terminal;
- a receiving terminal; and
- an antenna switch circuit coupled to the antenna terminal, to the receiving terminal, and to the first conductor layer.

19. A wireless communication system according to claim 12, wherein the control signal from the second strip constitutes an output of a directional coupler.

20. A wireless communication system according to claim 12, wherein the width of the first strip is wider than the width of the second strip.

21. A wireless communication system according to claim 12, wherein the width of the second strip is wider the the width of the first strip.

* * * * *